US012484459B2

(12) United States Patent
Chuang et al.

(10) Patent No.: US 12,484,459 B2
(45) Date of Patent: Nov. 25, 2025

(54) PLANARIZATION-LESS PHASE CHANGE MATERIAL SWITCH

(71) Applicant: Taiwan Semiconductor Manufacturing Company Limited, Hsinchu (TW)

(72) Inventors: Harry-Hak-Lay Chuang, Zhubei (TW); Chia Wen Liang, Zhubei (TW); Chang-Chih Huang, Taichung (TW); Han-Yu Chen, Zhubei (TW); Kuo-Chyuan Tzeng, Chu-Pei (TW); Tsung-Hao Yeh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 765 days.

(21) Appl. No.: 17/829,562

(22) Filed: Jun. 1, 2022

(65) Prior Publication Data
US 2023/0397511 A1  Dec. 7, 2023

(51) Int. Cl.
*H10N 19/00* (2023.01)
*H10N 70/00* (2023.01)
(Continued)

(52) U.S. Cl.
CPC ......... *H10N 70/231* (2023.02); *H10N 70/063* (2023.02); *H10N 70/068* (2023.02);
(Continued)

(58) Field of Classification Search
CPC .. H10N 70/231; H10N 70/063; H10N 70/068; H10N 70/841; H10N 70/8613;
(Continued)

(56) References Cited

U.S. PATENT DOCUMENTS 10,461,253 B1 * 10/2019 Slovin ................. H10N 70/231
2008/0248624 A1 * 10/2008 Horak .................... H10B 63/80
257/E21.477
(Continued)

FOREIGN PATENT DOCUMENTS

TW      201803169 A     1/2018
TW      201937770 A     9/2019
(Continued)

OTHER PUBLICATIONS

Taiwan Patent and Trademark Office; TW Application No. 112114449, First Office Action mailed Feb. 5, 2024, 12 pages.

*Primary Examiner* — Samuel Park
(74) *Attorney, Agent, or Firm* — The Marbury Law Group, PLLC

(57) ABSTRACT

A dielectric isolation layer having a top surface may be formed over a substrate. A heater line, a phase change material (PCM) line, and an in-process conductive barrier plate may be formed over the dielectric isolation layer. An electrode material layer may be formed over the in-process conductive barrier plate. The electrode material layer and the in-process conductive barrier plate may be patterned such that patterned portions of the in-process conductive barrier plate include a first conductive barrier plate contacting a first area of a top surface of the PCM line, and a second conductive barrier plate contacting a second area of the top surface of the PCM line, and patterned portions of the electrode material layer include a first electrode contacting the first conductive barrier plate and a second electrode contacting the second conductive barrier plate.

20 Claims, 17 Drawing Sheets

(51) Int. Cl.
  *H10N 70/20* (2023.01)
  *H10N 79/00* (2023.01)
(52) U.S. Cl.
  CPC ....... *H10N 70/841* (2023.02); *H10N 70/8613* (2023.02); *H10N 79/00* (2023.02)
(58) Field of Classification Search
  CPC .. H10N 79/00; H10N 70/826; H10N 70/8413; H10N 70/8828
  See application file for complete search history.

(56) References Cited

U.S. PATENT DOCUMENTS

| | | | |
|---|---|---|---|
| 2010/0261329 A1* | 10/2010 | Lung | H10N 70/231 257/E21.003 |
| 2011/0237045 A1 | 9/2011 | Bez et al. | |
| 2017/0288138 A1 | 10/2017 | Lee et al. | |
| 2017/0373120 A1 | 12/2017 | Zuliani et al. | |
| 2021/0057487 A1 | 2/2021 | Shea et al. | |

FOREIGN PATENT DOCUMENTS

| | | | |
|---|---|---|---|
| TW | 202034549 A | 9/2020 |
| TW | 202131411 A | 8/2021 |
| TW | 202201822 A | 1/2022 |
| TW | 202205622 A | 2/2022 |

* cited by examiner

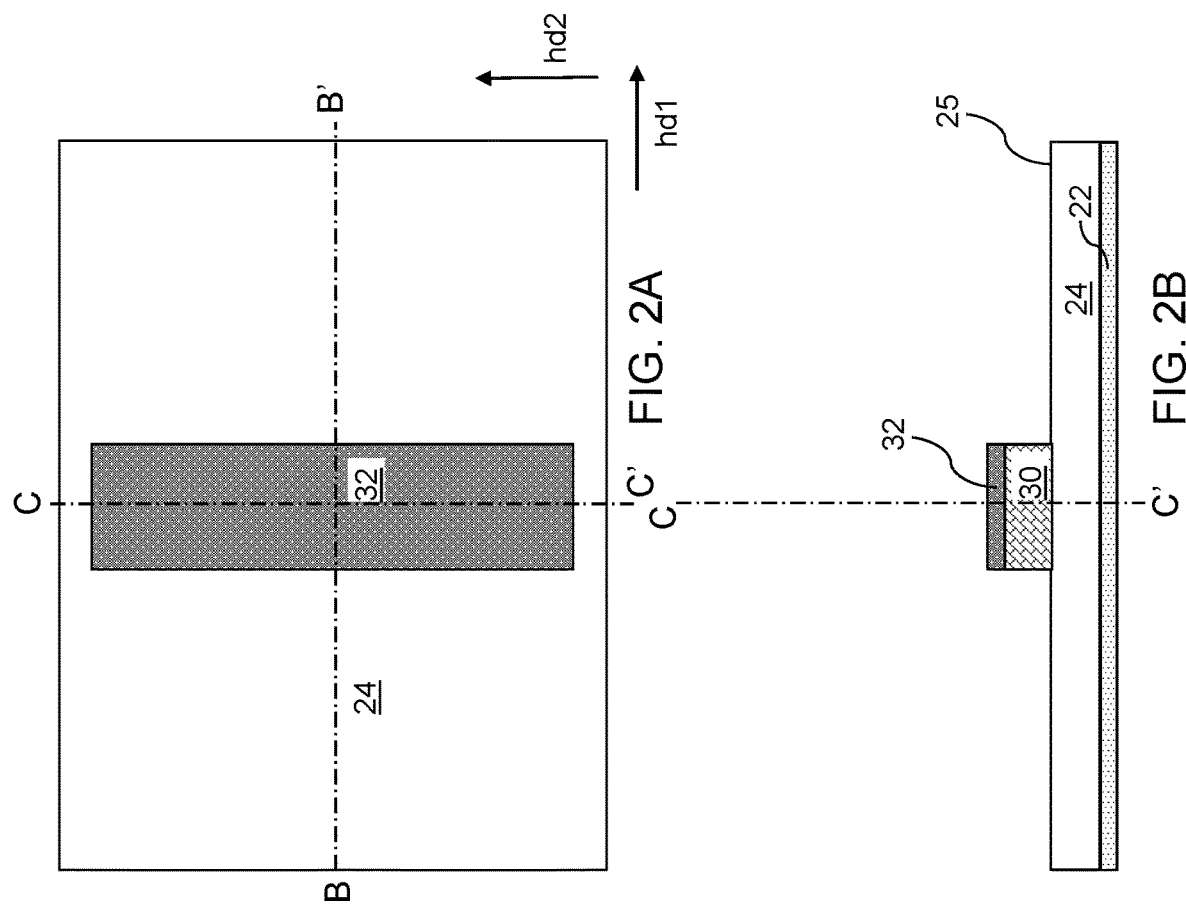

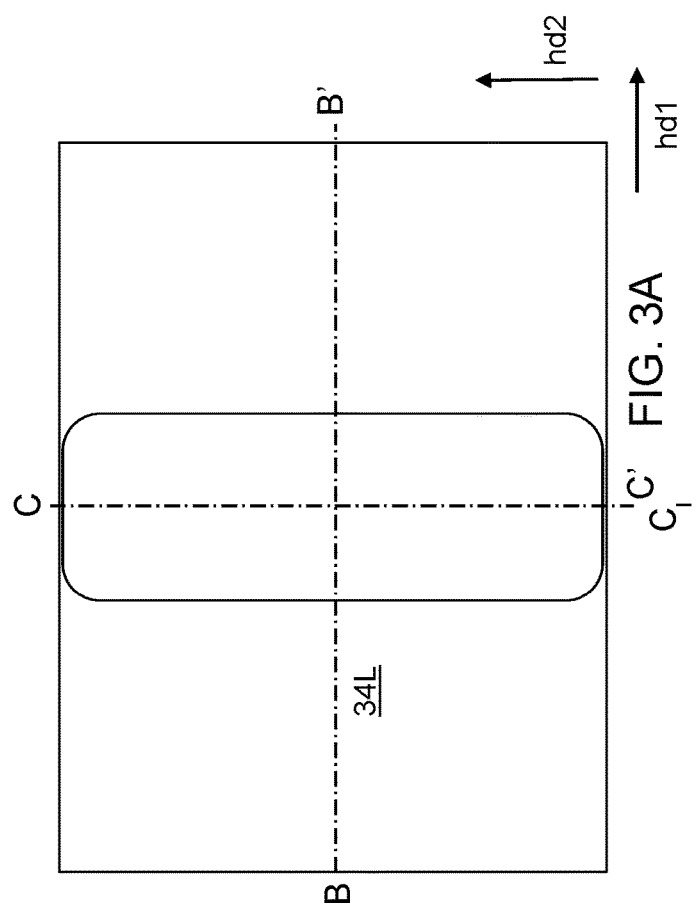
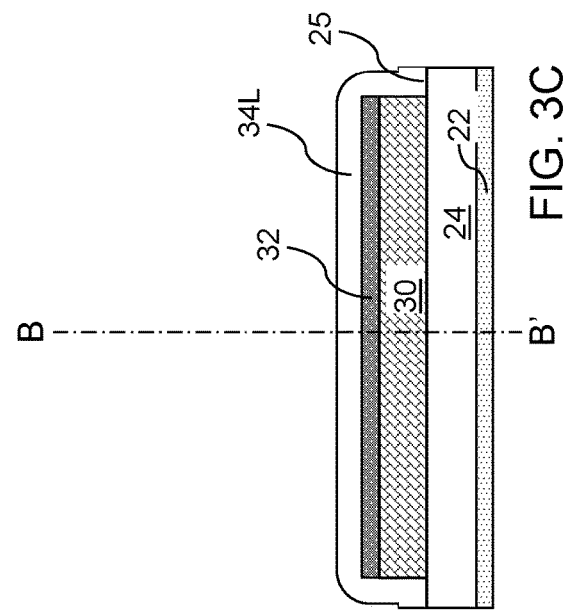
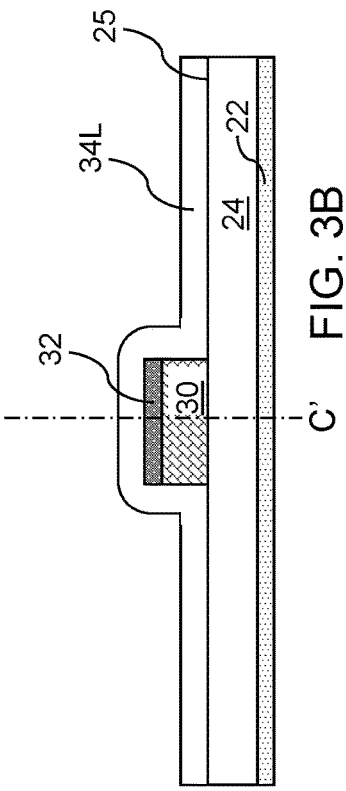
FIG. 3A
FIG. 3B
FIG. 3C

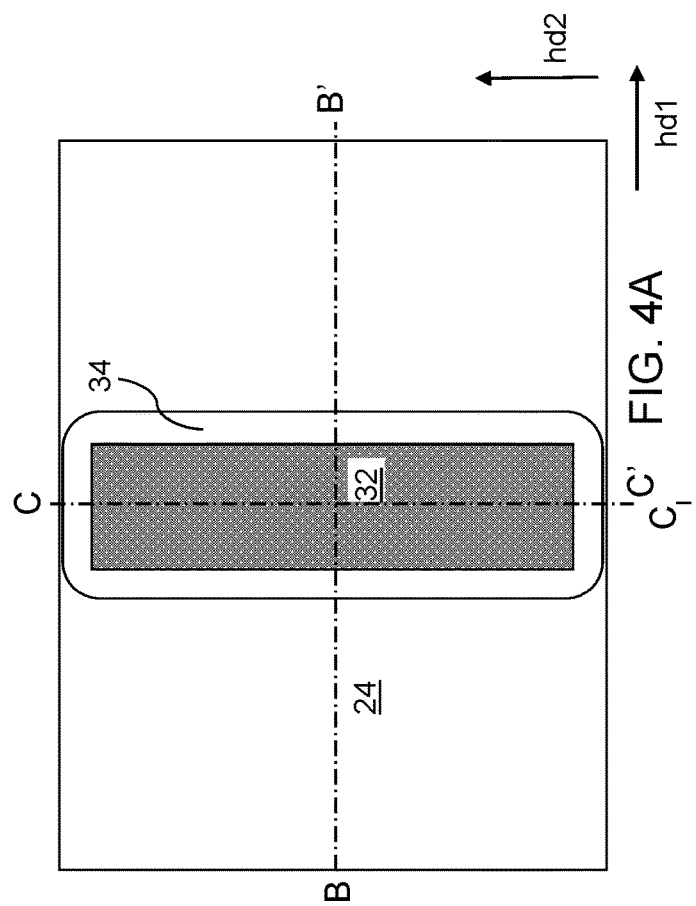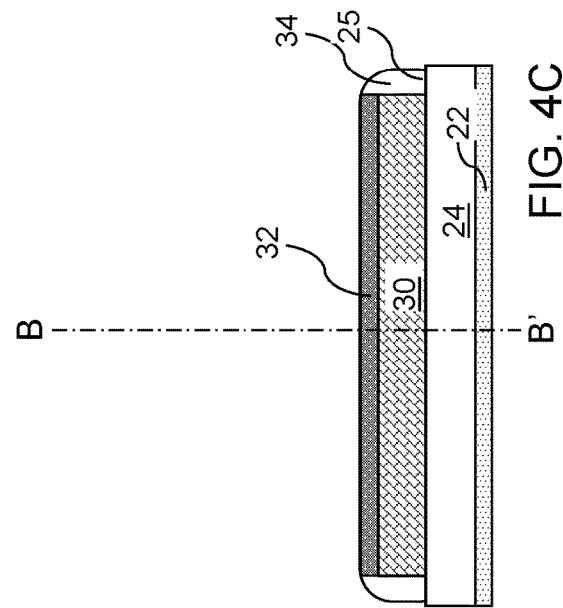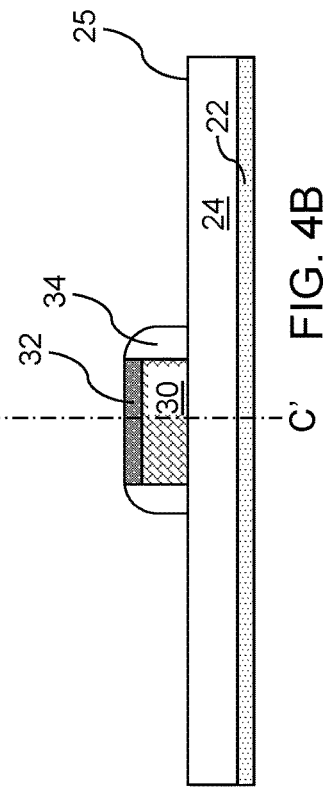

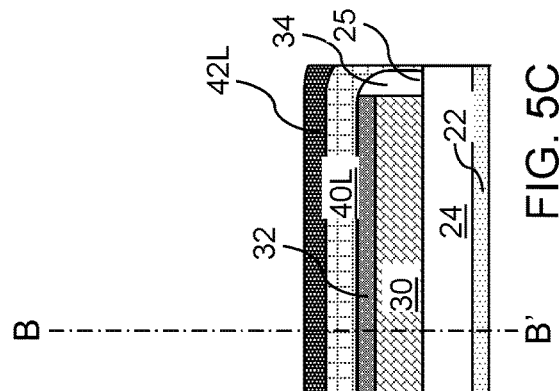
FIG. 5C
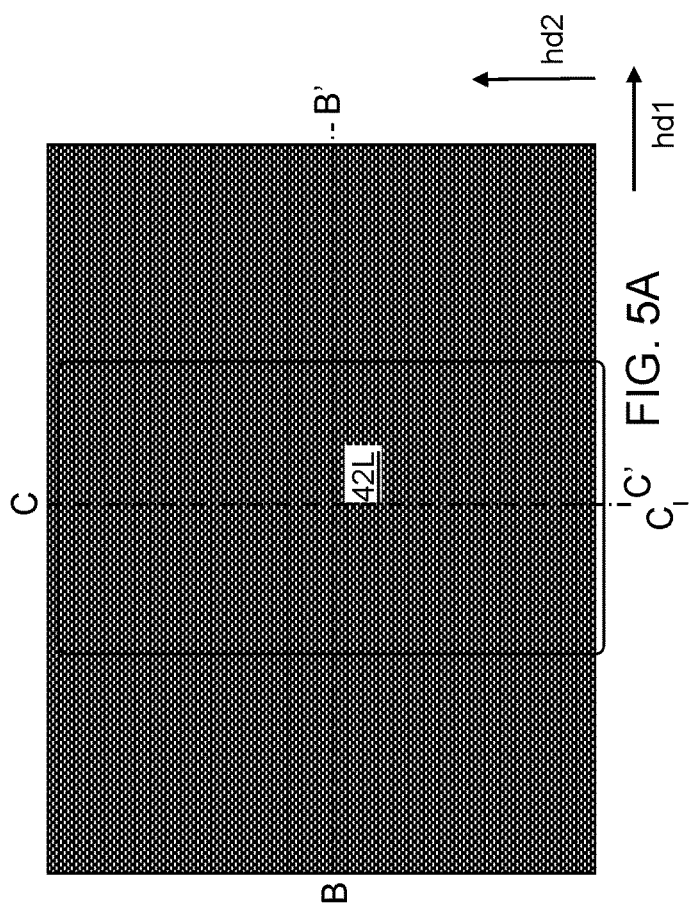
FIG. 5A
FIG. 5B

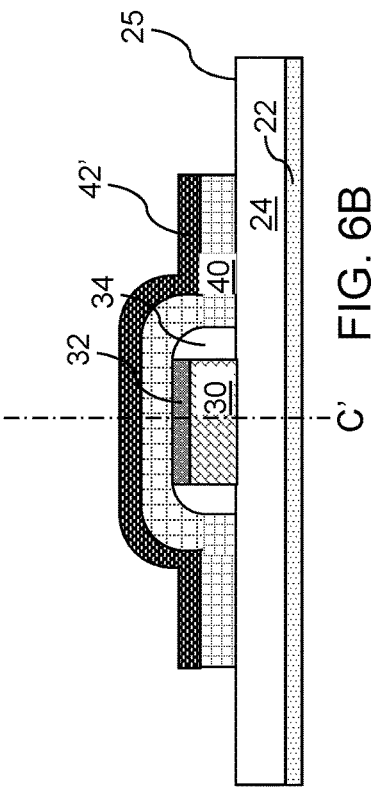
FIG. 6C
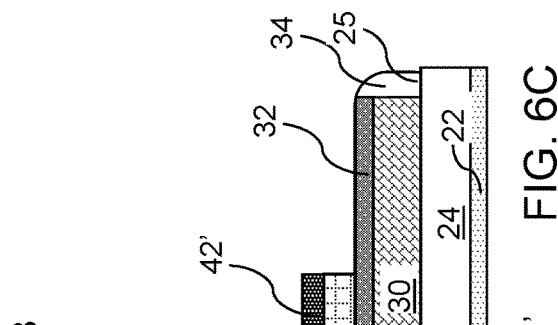
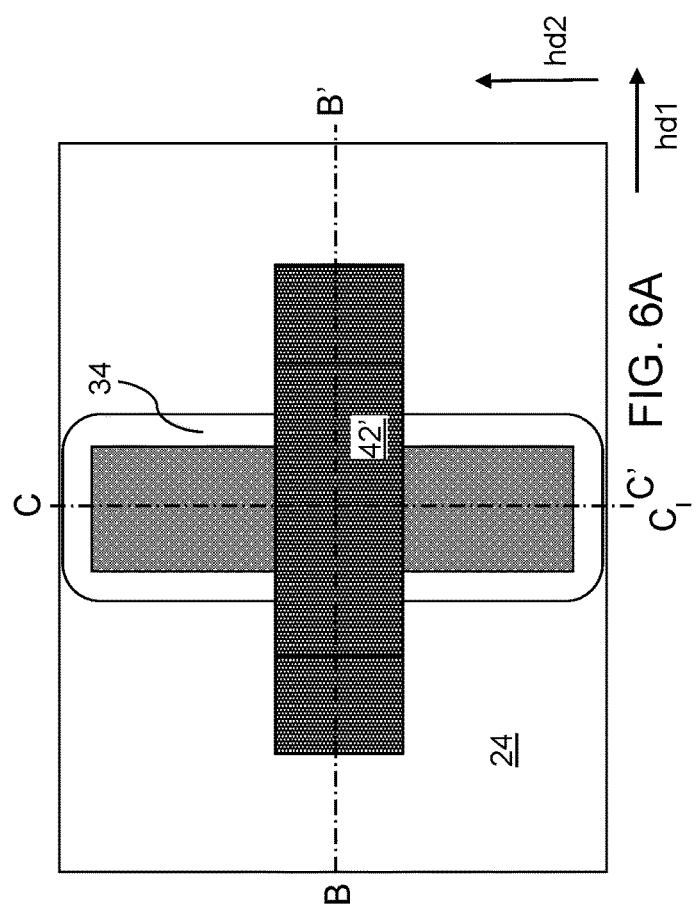
FIG. 6A
FIG. 6B

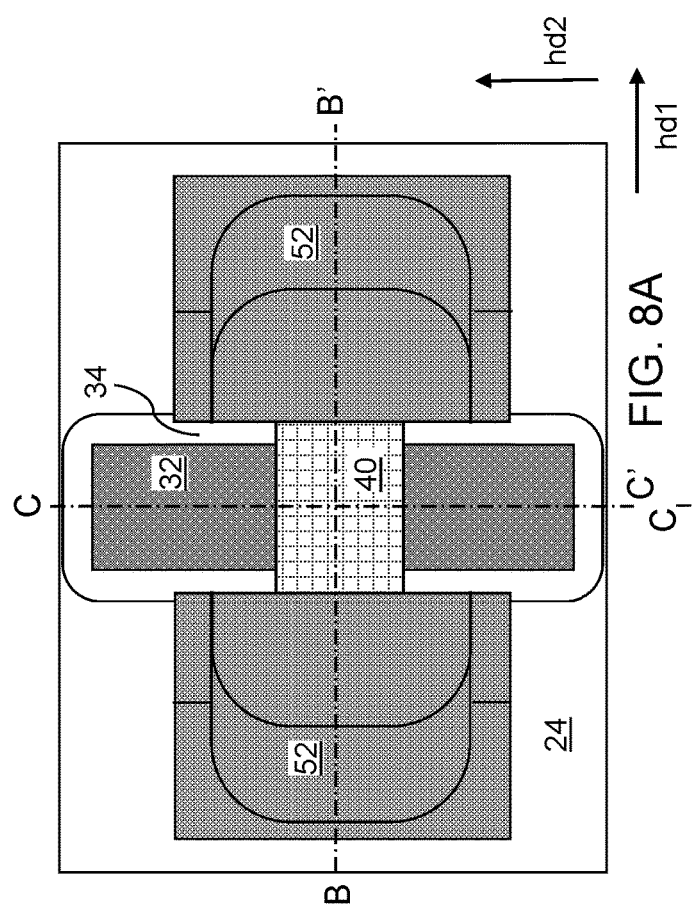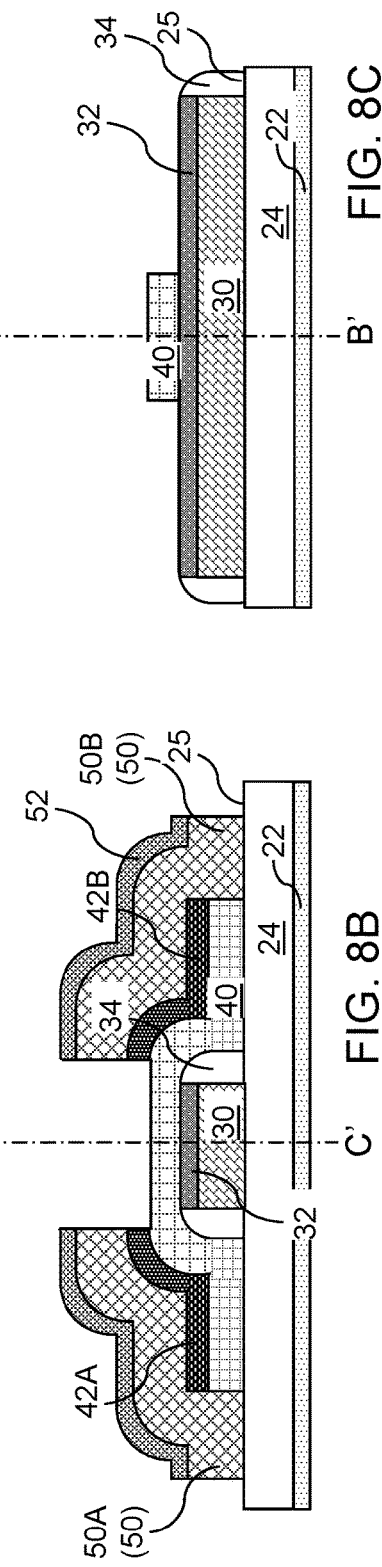

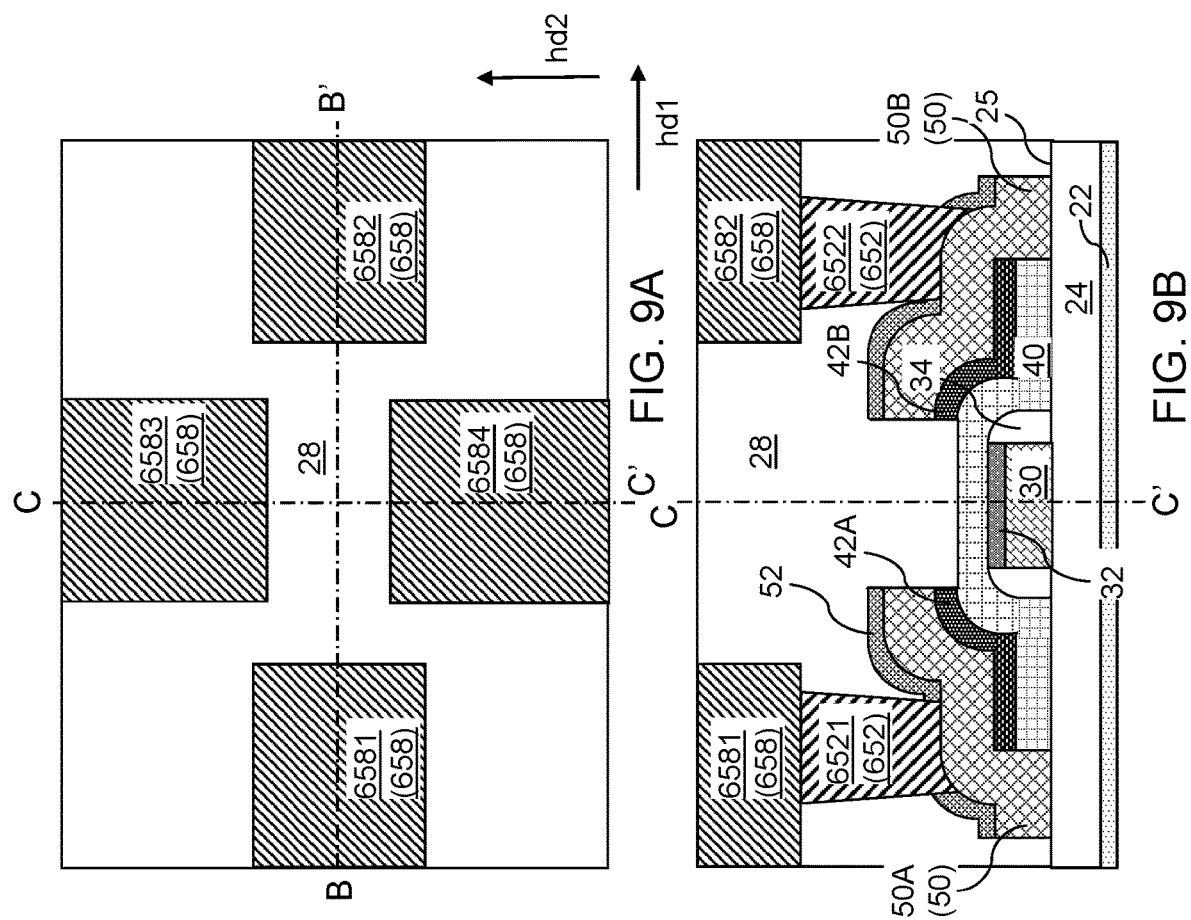

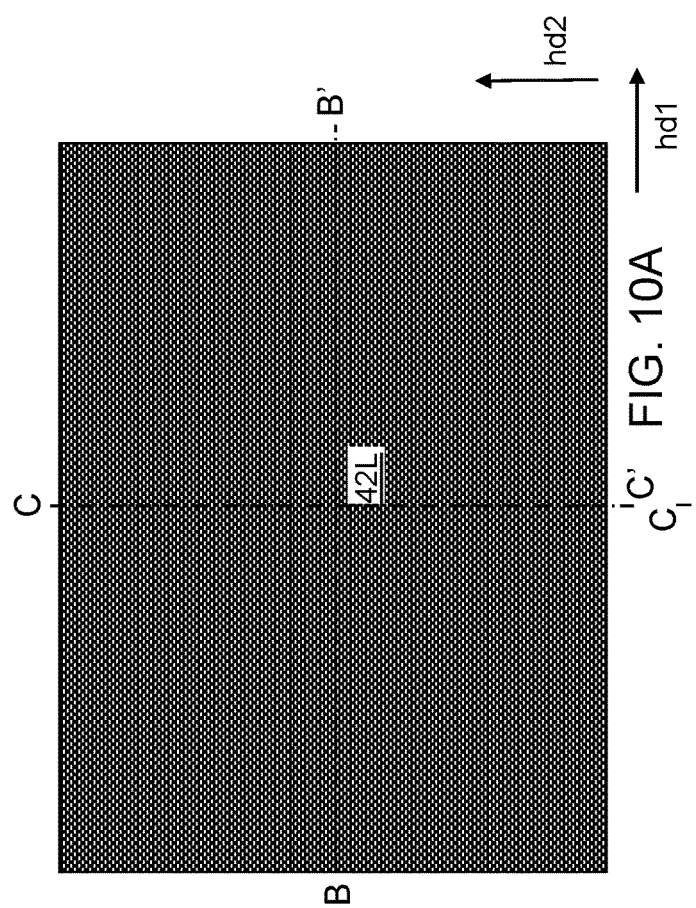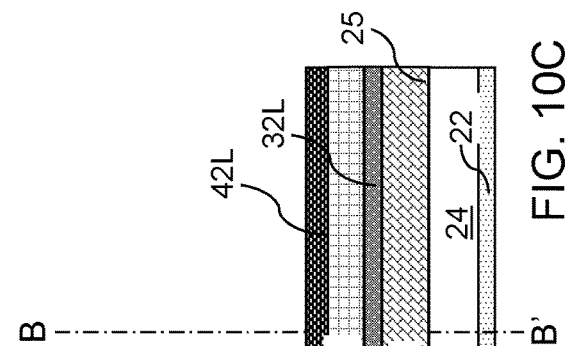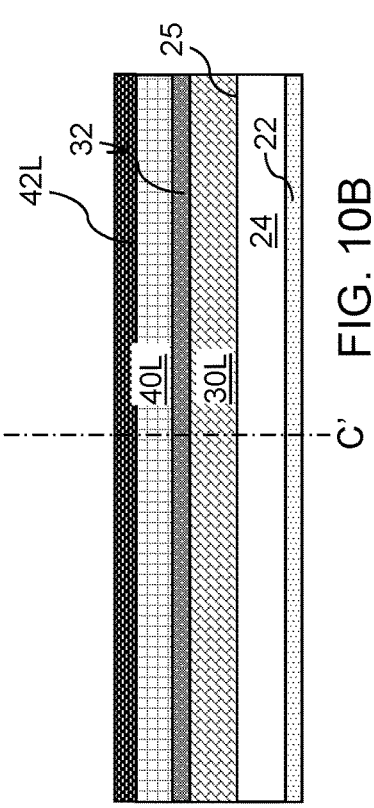

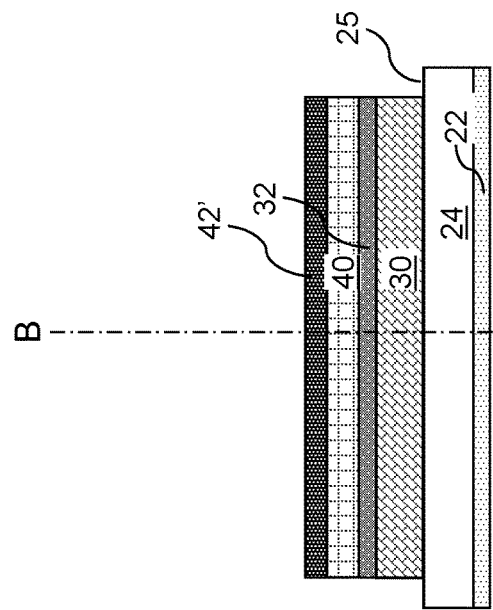
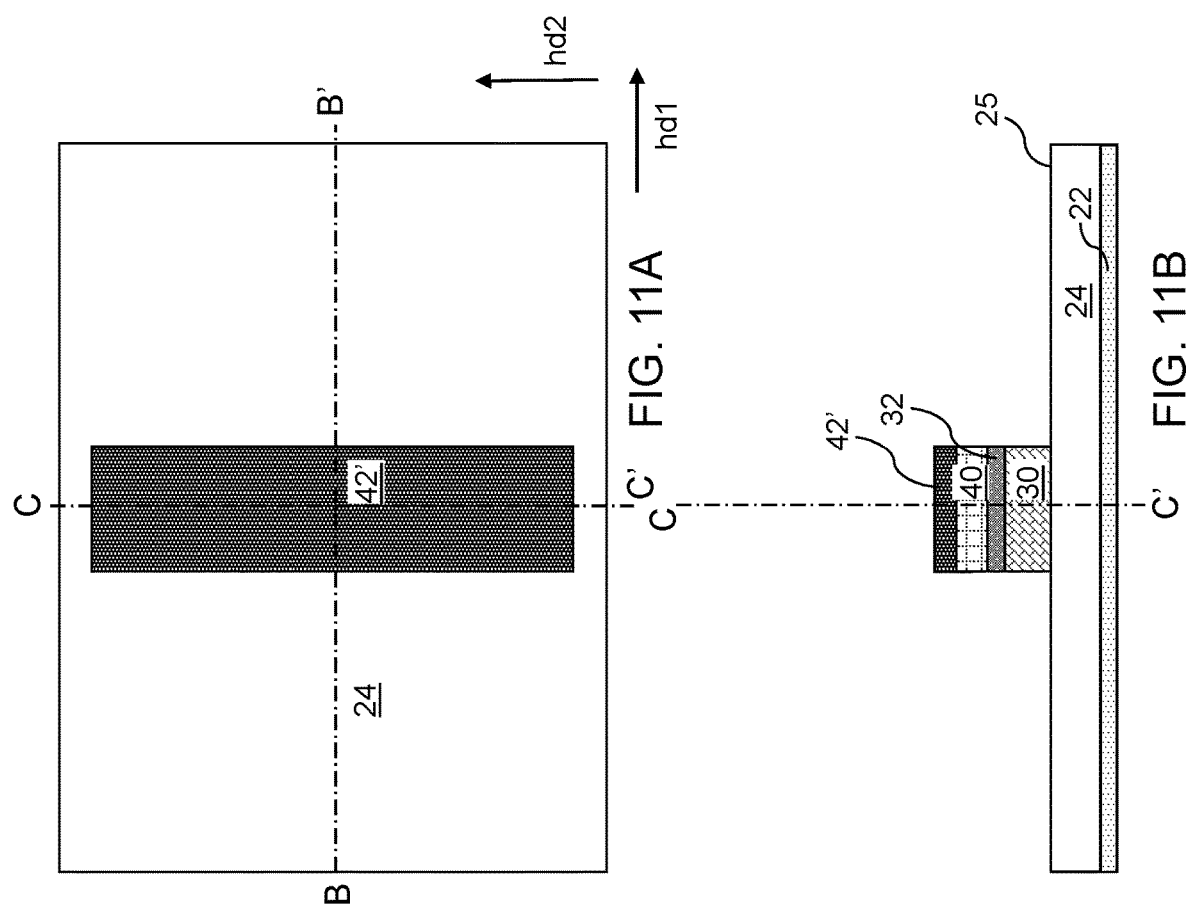

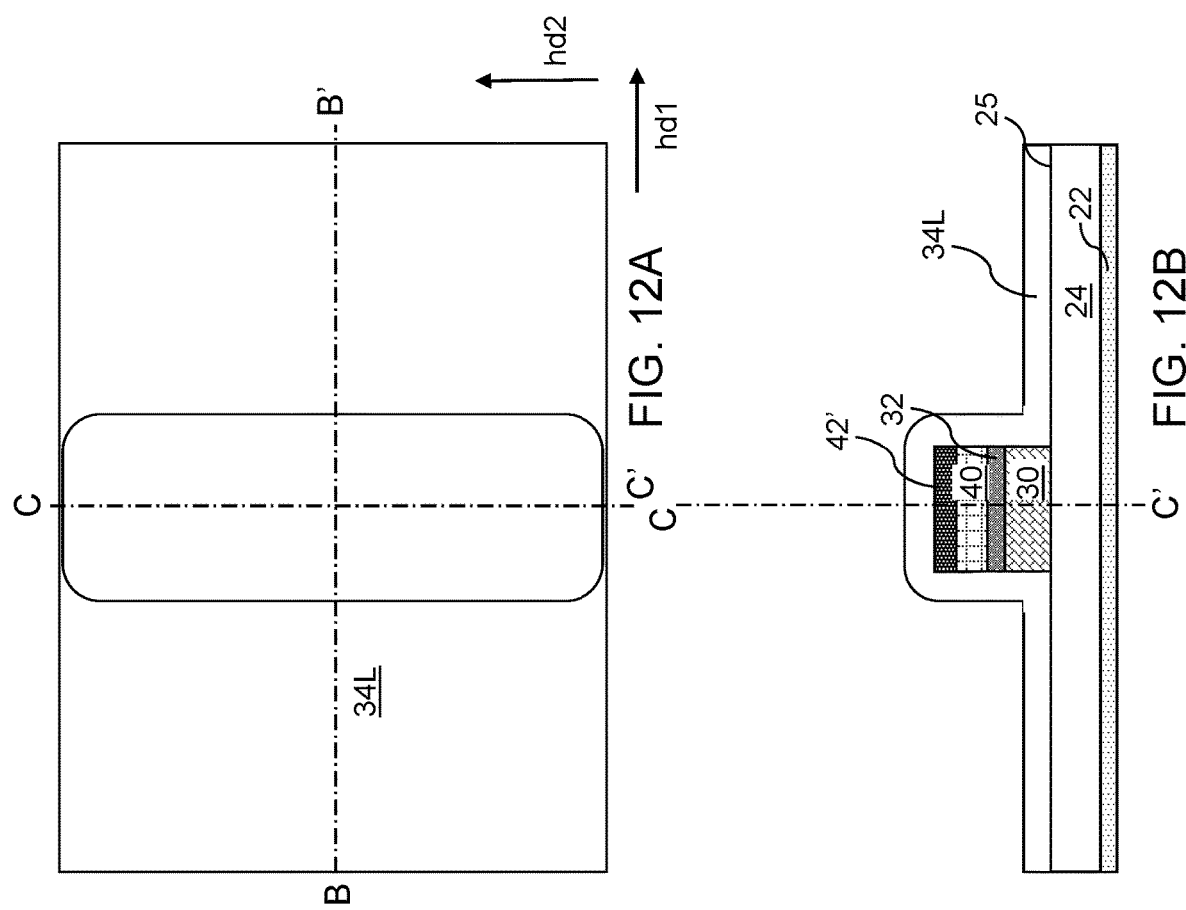

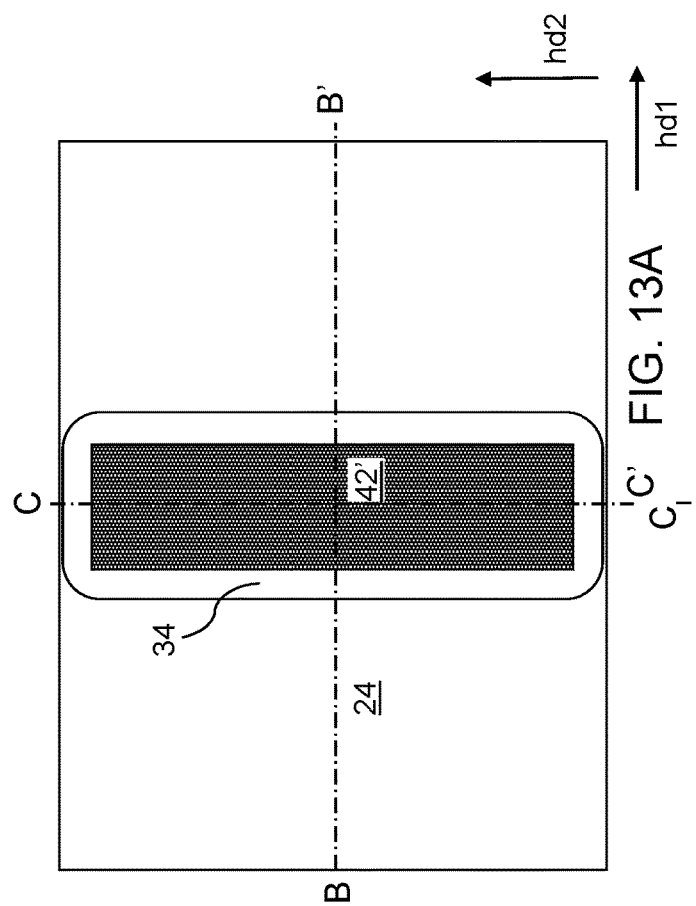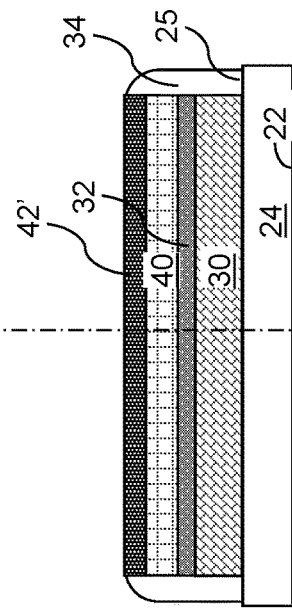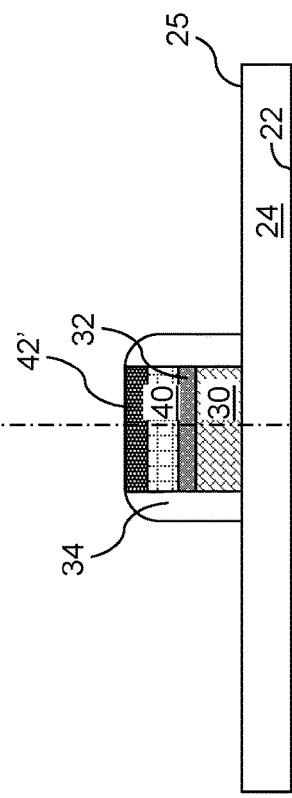

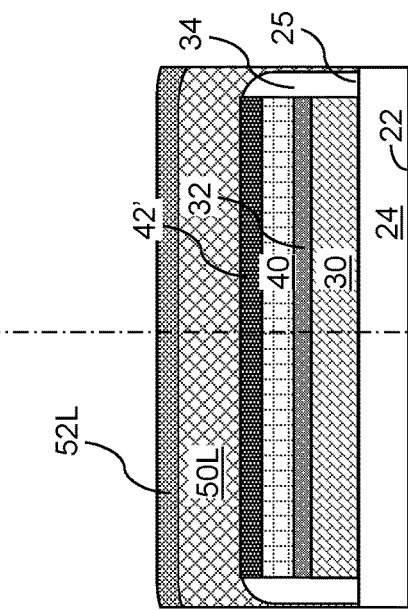
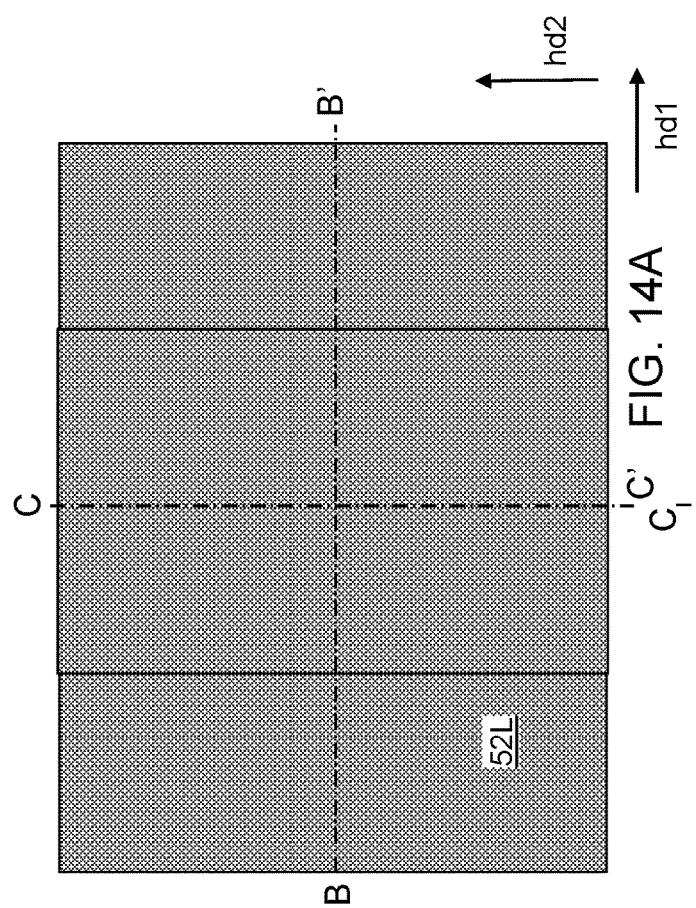
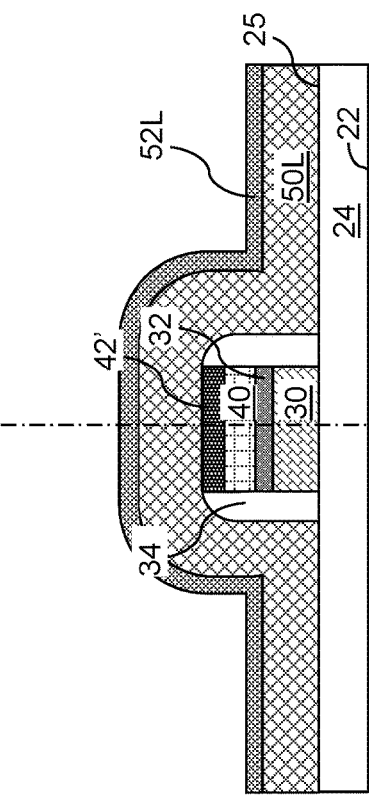

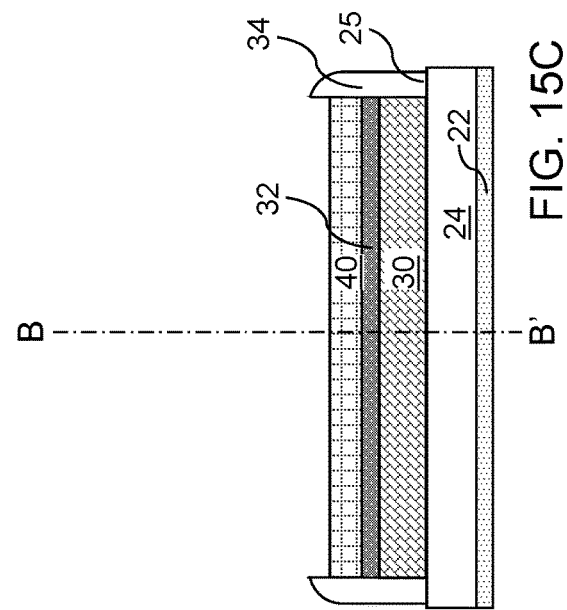
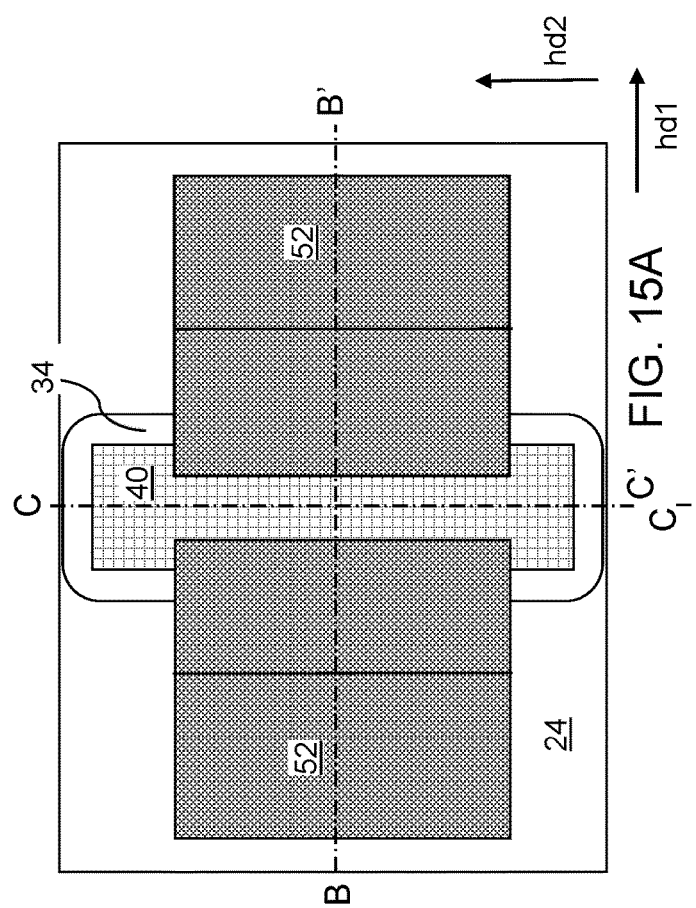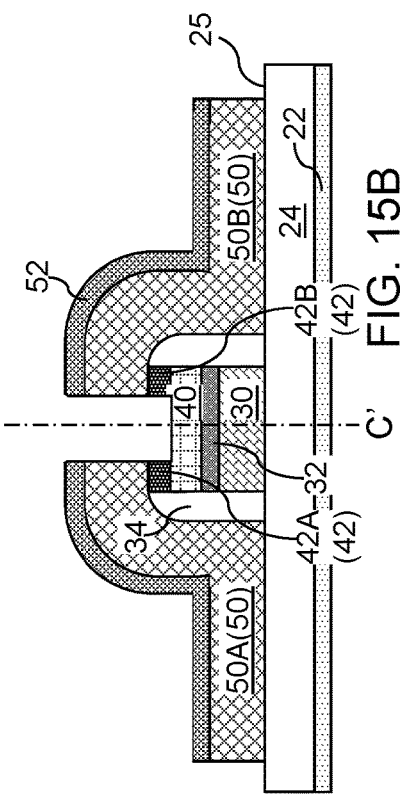
FIG. 15A
FIG. 15B
FIG. 15C

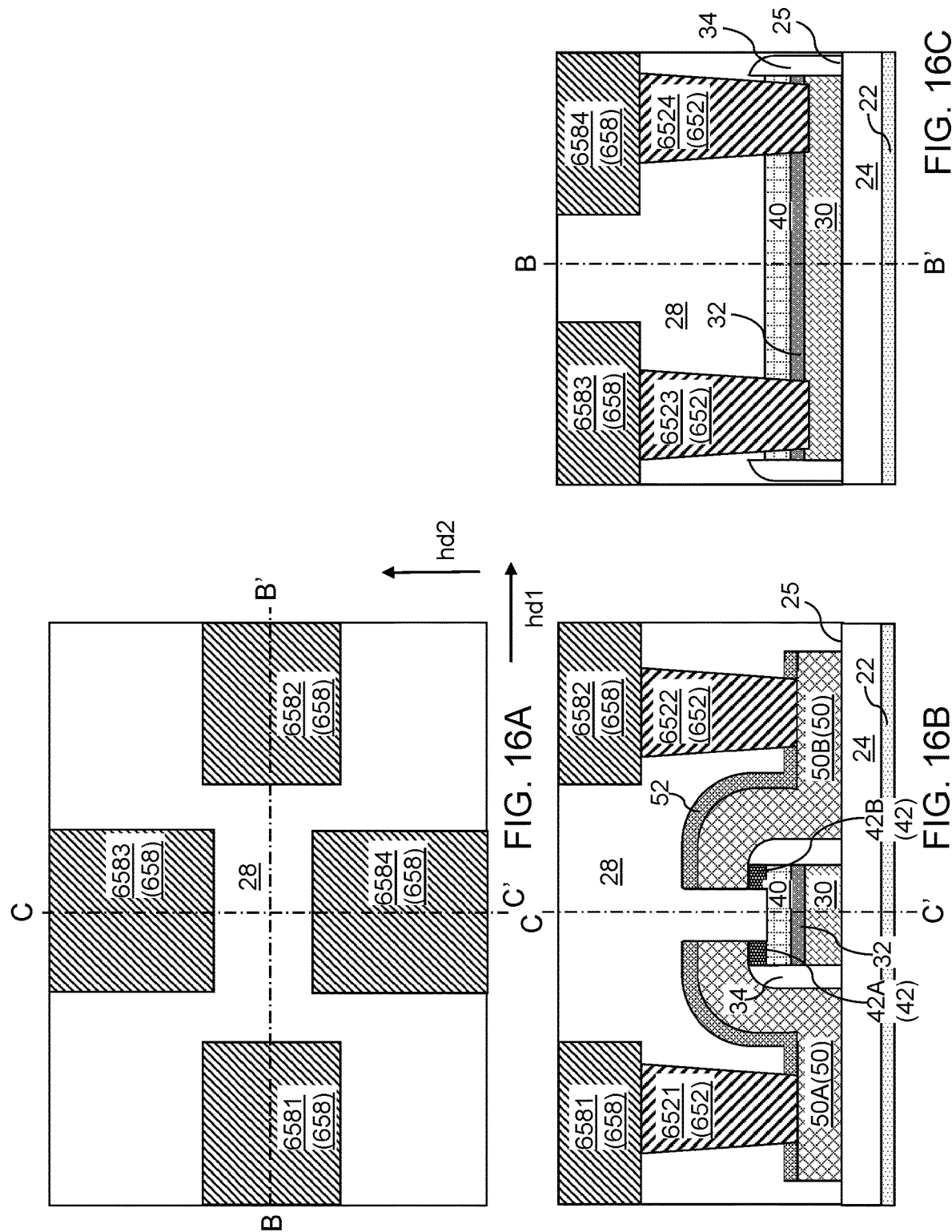

PLANARIZATION-LESS PHASE CHANGE MATERIAL SWITCH

BACKGROUND

Phase change material switches are useful devices that may mitigate against interference due to electromagnetic radiation, and may be used for various applications such as radio-frequency applications. Manufacture of the phase change material switches as known in the art typically use multiple chemical mechanical polishing processes. Use of the multiple chemical mechanical polishing processes may increase the manufacturing cost for such phase change material switches. Reduction or elimination of such chemical mechanical planarization processes may reduce the manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are various views of the first exemplary structure after formation of a heater-capping dielectric plate and a heater line according to a first embodiment of the present disclosure. FIG. 2A is a top-down view, and FIGS. 2B and 2C are vertical cross-sectional views along the vertical plane B-B' or C-C' of FIG. 2A, respectively.

FIGS. 3A-3C are various views of the first exemplary structure after formation of a dielectric spacer material layer according to the first embodiment of the present disclosure. FIG. 3A is a top-down view, and FIGS. 3B and 3C are vertical cross-sectional views along the vertical plane B-B' or C-C' of FIG. 3A, respectively.

FIGS. 4A-4C are various views of the first exemplary structure after formation of a dielectric spacer according to the first embodiment of the present disclosure. FIG. 4A is a top-down view, and FIGS. 4B and 4C are vertical cross-sectional views along the vertical plane B-B' or C-C' of FIG. 4A, respectively.

FIGS. 5A-5C are various views of the first exemplary structure after formation of a phase change material layer and a conductive barrier material layer according to the first embodiment of the present disclosure. FIG. 5A is a top-down view, and FIGS. 5B and 5C are vertical cross-sectional views along the vertical plane B-B' or C-C' of FIG. 5A, respectively.

FIGS. 6A-6C are various views of the first exemplary structure after formation of an in-process conductive barrier plate and a phase change material (PCM) line according to the first embodiment of the present disclosure. FIG. 6A is a top-down view, and FIGS. 6B and 6C are vertical cross-sectional views along the vertical plane B-B' or C-C' of FIG. 6A, respectively.

FIG. 7A is a top-down view, and FIGS. 7B and 7C are vertical cross-sectional views along the vertical plane B-B' or C-C' of FIG. 7A, respectively.

FIGS. 8A-8C are various views of the first exemplary structure after formation of electrode-capping dielectric plates, electrodes, and conductive barrier plates according to the first embodiment of the present disclosure. FIG. 8A is a top-down view, and FIGS. 8B and 8C are vertical cross-sectional views along the vertical plane B-B' or C-C' of FIG. 8A, respectively.

FIGS. 9A-9C are various views of the first exemplary structure after formation of a dielectric material layer and additional metal interconnect structures according to the first embodiment of the present disclosure. FIG. 9A is a top-down view, and FIG. 9B and FIG. 9C are vertical cross-sectional views along the vertical plane B-B' or C-C' of FIG. 9A, respectively.

FIGS. 10A-10C are various views of a second exemplary structure after formation of an optional dielectric capping layer, a dielectric isolation layer, a heater material layer, and a heater-capping dielectric layer, a phase change material layer, and a conductive barrier material layer according to the second embodiment of the present disclosure. FIG. 10A is a top-down view, and FIGS. 10B and 10C are vertical cross-sectional views along the vertical plane B-B' or C-C' of FIG. 10A, respectively.

FIGS. 11A-11C are various views of the second exemplary structure after formation of an in-process conductive barrier plate, a phase change material (PCM) line, a heater-capping dielectric plate, and a heater line according to the second embodiment of the present disclosure. FIG. 11A is a top-down view, and FIGS. 11B and 11C are vertical cross-sectional views along the vertical plane B-B' or C-C' of FIG. 11A, respectively.

FIGS. 12A-12C are various views of the second exemplary structure after formation of a dielectric spacer material layer according to the second embodiment of the present disclosure. FIG. 12A is a top-down view, and FIGS. 12B and 12C are vertical cross-sectional views along the vertical plane B-B' or C-C' of FIG. 12A, respectively.

FIGS. 13A-13C are various views of the second exemplary structure after formation of a dielectric spacer according to the second embodiment of the present disclosure. FIG. 13A is a top-down view, and FIGS. 13B and 13C are vertical cross-sectional views along the vertical plane B-B' or C-C' of FIG. 13A, respectively.

FIGS. 14A-14C are various views of the second exemplary structure after formation of an electrode material layer and an electrode-capping dielectric layer according to the second embodiment of the present disclosure. FIG. 14A is a top-down view, and FIGS. 14B and 14C are vertical cross-sectional views along the vertical plane B-B' or C-C' of FIG. 14A, respectively.

FIGS. 15A-15C are various views of the second exemplary structure after formation of electrode-capping dielectric plates, electrodes, and conductive barrier plates according to the second embodiment of the present disclosure. FIG. 15A is a top-down view, and FIGS. 15B and 15C are vertical cross-sectional views along the vertical plane B-B' or C-C', respectively.

FIGS. 16A-16C are various views of the second exemplary structure after formation of a dielectric material layer and additional metal interconnect structures according to the second embodiment of the present disclosure. FIG. 16A is a top-down view, and FIGS. 16B and 16C are vertical cross-sectional views along the vertical plane B-B' or C-C' of FIG. 16A, respectively.

DETAILED DESCRIPTION

Figure 1:
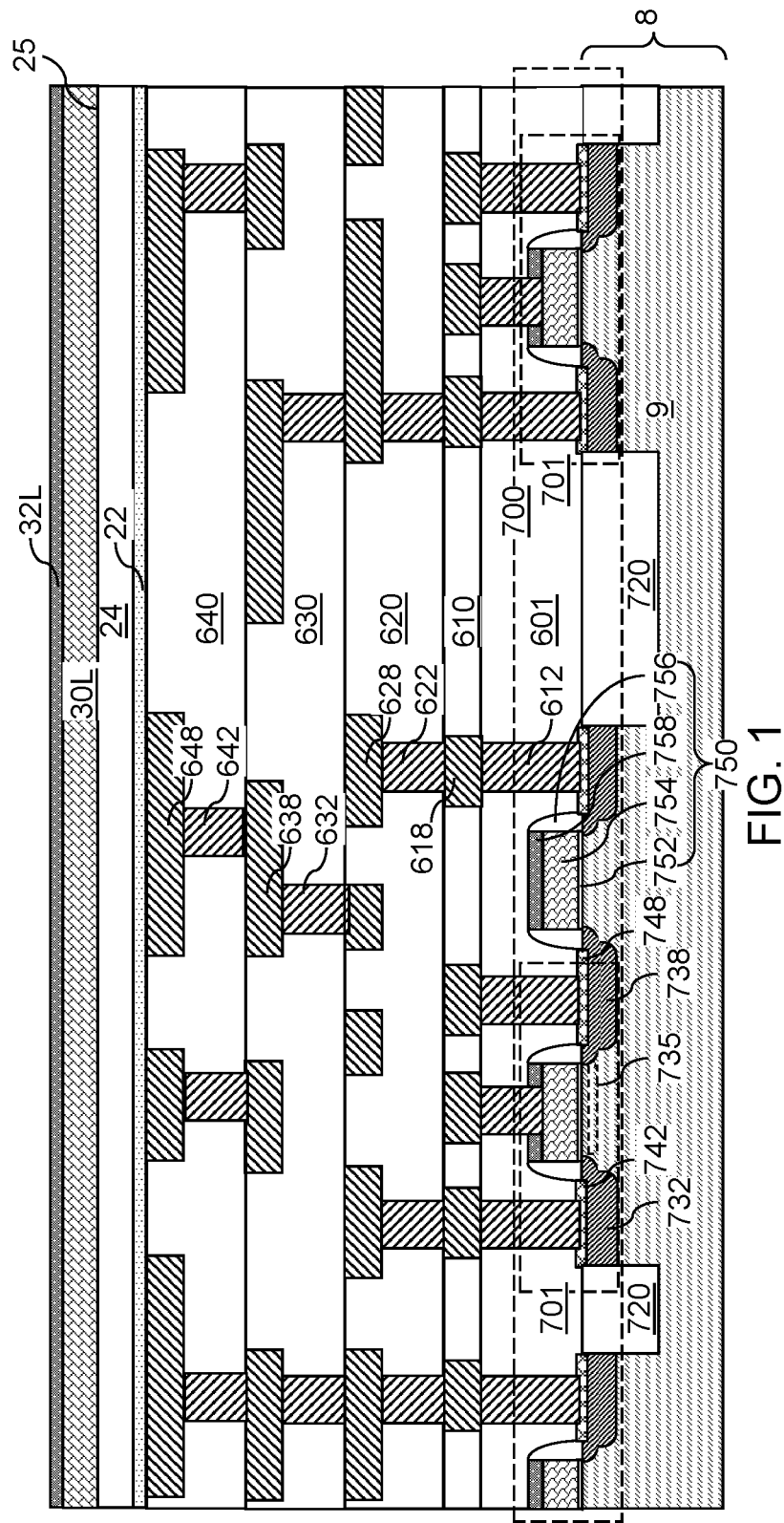
FIG. 1 is a vertical cross-sectional view of a first exemplary structure after formation of complementary metal-oxide-semiconductor (CMOS) transistors, metal interconnect structures and dielectric material layers, an optional dielectric capping layer, a dielectric isolation layer, a heater material layer, and a heater-capping dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the various embodiment structures and methods disclosed herein may be used to form a phase change material (PCM) switch. Such embodiment PCM switches may be used to provide a switching function for various semiconductor devices such as radio-frequency semiconductor devices, varactors (i.e., variable capacitance capacitors), inductors, or other semiconductor devices. The various embodiments of the present disclosure are now described with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of an energy harvesting device and/or to a battery structure to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices 701 may be formed on a substrate 8, and metal interconnect structures (612, 618, 622, 628, 631, 638, 642, 648) and dielectric material layers (601, 610, 620, 630, 640) over the semiconductor devices 701. The metal interconnect structures (612, 618, 622, 628, 631, 638, 642, 648) may be formed in the dielectric material layers (601, 610, 620, 630, 640), and may be electrically connected to the semiconductor devices.

An optional dielectric capping layer 22, a dielectric isolation layer 24, a heater material layer 30L, and a heater-capping dielectric layer 32L may be deposited over the metal interconnect structures (612, 618, 622, 628, 631, 638, 642, 648) and dielectric material layers (601, 610, 620, 630, 640). The optional dielectric capping layer 22 includes a dielectric capping material such as silicon carbide, silicon nitride, or silicon carbide nitride. Other suitable dielectric capping materials are within the contemplated scope of disclosure. The thickness of the optional dielectric capping layer 22, if present, may be in a range from 2 nm to 100 nm, although lesser and greater thicknesses may also be used. The dielectric isolation layer 24 comprises a dielectric material such as undoped silicate glass or a doped silicate glass. The dielectric isolation layer 24 may comprise a planar top surface 25, i.e., a top surface located entirely within a horizontal plane. The thickness of the dielectric isolation layer 24 may be in a range from 100 nm to 300 nm, such as from 120 nm to 200 nm, although lesser and greater thicknesses may also be used.

The heater material layer 30L includes a metallic material having a lower electrical conductivity than copper or aluminum. The heater material layer 30L may comprise a refractory elemental metal such as tungsten, rhenium, tantalum, molybdenum, or niobium, or may comprises a conductive metallic nitride material such as tungsten nitride, titanium nitride, or tantalum nitride. Other suitable heater materials are within the contemplated scope of disclosure. The thickness of the heater material layer 30L may be in a range from 50 nm to 300 nm, such as from 100 nm to 200 nm, although lesser and greater thicknesses may also be used. The heater-capping dielectric layer 32L comprises a dielectric material such as silicon nitride, silicon carbide, silicon carbide nitride, or a dielectric metal oxide such as aluminum oxide, hafnium oxide, tantalum oxide, yttrium oxide, or lanthanum oxide. Other suitable heater-capping dielectric materials are within the contemplated scope of disclosure. The thickness of the heater-capping dielectric layer 32L may be in a range from 20 nm to 100 nm, such as from 30 nm to 60 nm, although lesser and greater thicknesses may also be used.

Referring to FIGS. 2A-2C, a photoresist layer (not shown) may be applied over the heater-capping dielectric layer 32L, and may be lithographically patterned to form a discrete photoresist material portion having an elongated horizontal cross-sectional shape such as a rectangular shape. In one embodiment, the elongated shape may be a rectangular shape having a uniform width along a first horizontal direction hd1 and having a length that is greater than the uniform width along a second horizontal direction hd2. An anisotropic etch process, such as a reactive ion etch process, may be performed to etch unmasked portions of the heater-capping dielectric layer 32L and the heater material layer 30L. The anisotropic etch process may be selective to the material of the dielectric isolation layer 24, and the planar top surface 25 of the dielectric isolation layer 24 may be physically exposed in areas that are not masked by the discrete photoresist material portion. A remaining portion of the heater material layer comprises a heater line 30, and a remaining portion of the heater-capping dielectric layer 32L comprises a heater-capping dielectric plate 32. In one embodiment, the heater line 30 and the heater-capping dielectric plate 32 may have the same area. The discrete photoresist material portion may be subsequently removed, for example, by ashing. The heater line 30 contacts a first area of the planar top surface 25, and the heater-capping dielectric plate 32 contacts the top surface of the heater line 30.

Referring to FIGS. 3A-3C, a dielectric spacer material layer 34L may be formed by conformal deposition of a dielectric spacer material. The dielectric spacer material may comprise undoped silicate glass or a doped silicate glass, and may be formed, for example, by chemical vapor deposition. Other suitable dielectric spacer materials are within the contemplated scope of disclosure. The lateral thickness of vertically-extending portions of the dielectric spacer material layer 34L over sidewalls of the heater line 30 may be in a range from 100 nm to 300 nm, such as from 120 nm to 200 nm, although lesser and greater lateral thicknesses may also be used.

Referring to FIGS. 4A-4C, an anisotropic etch process may be performed to remove horizontally-extending portions of the dielectric spacer material layer 34L. Specifically, the anisotropic etch process may remove a portion of the dielectric spacer material layer 34L overlying the top surface of the heater-capping dielectric plate 32 and a portions of the dielectric spacer material layer 34L that are laterally spaced from the sidewalls of heater line 30 by a distance greater than the lateral thickness of the dielectric spacer material layer 34L. A remaining portion of the dielectric spacer material layer 34L constitutes a dielectric spacer 34. The dielectric spacer 34 may be formed around, and directly on, the heater line 30.

In one embodiment, a bottom surface of the dielectric spacer 34 has an inner periphery that may coincide with a periphery of the bottom surface of the heater line 30, and an outer periphery of the bottom surface of the dielectric spacer 34 may laterally offset from the inner periphery by a uniform lateral offset distance, which is the lateral thickness of the dielectric spacer 34. The dielectric spacer 34 may contact the entirety of the each sidewall of the heater line 30, and may contact at least a lower portion of each sidewall of the heater-capping dielectric plate 32. In one embodiment, the entirety of the bottom surface of the dielectric spacer 34 may be in contact with an area of the planar top surface 25 of the dielectric isolation layer 24.

Referring to FIGS. 5A-5C, a phase change material layer 40L and a conductive barrier material layer 42L may be formed over the dielectric spacer 34, the heater-capping dielectric plate 32, and the planar top surface 25 of the dielectric isolation layer 24. As used herein, a "phase change material" refers to a material having at least two different phases providing different resistivity. A phase change material (PCM) may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. The phase change material may be doped (e.g., nitrogen doped GST) or undoped to enhance resistance-switching characteristics. The thickness of the phase change material layer 40L (which is also referred to as a PCM material layer 40L) may be in a range from 30 nm to 600 nm, such as from 60 nm to 300 nm, although lesser and greater thicknesses may also be used.

The conductive barrier material layer 42L may include a conductive material that may function as an effective barrier against diffusion of the phase change material in the PCM material layer 40. For example, the conductive barrier material layer 42L may comprise a carbon-based material (such as graphene or carbon nanotubes), a metallic diffusion barrier material (such as tungsten nitride, titanium nitride, tantalum nitride, or molybdenum nitride), or any other suitable conductive barrier material that may effectively suppress outdiffusion of the phase change material in the PCM material layer 40L. The thickness of the conductive barrier material layer 42L may be in a range from 5 nm to 100 nm, such as from 10 nm to 50 nm, although lesser and greater thicknesses may also be used.

The conductive barrier material layer 42L may contact the entirety of a contoured top surface of the PCM line 40. In one embodiment, the conductive barrier material layer 42L may have a contoured top surface that includes a first planar surface segment within the area of the underlying heater line 30, a second planar surface segment outside the area of vertically-extending portions of the PCM material layer and may have a convex surface segment connecting the first planar surface segment and the second planar surface segment.

Referring to FIGS. 6A-6C, a photoresist layer (not shown) may be applied over the conductive barrier material layer 42L, and may be lithographically patterned to provide an elongated photoresist material portion that straddles the hater-capping dielectric plate 32. Unmasked portions of the conductive barrier material layer 42L and unmasked portions of the PCM material layer 40L may be etched by performing an anisotropic etch process that uses the patterned photoresist material portion as an etch mask. A remaining portion of the conductive barrier material layer 42L comprises an in-process conductive barrier plate 42' (which is patterned further in subsequent processing steps). A remaining portion of the PCM material layer 40L may include a phase change material line 40, which is also referred to as a PCM line 40. The PCM line 40 and the in-process conductive barrier plate 42' straddle the combination of the heater line 30, the heater-capping dielectric plate 32, and the dielectric spacer 34. As used herein, an "in-process" element refers to an element that is modified in a subsequent processing step. Areas of the planar top surface 25 that are not covered by the heater line 30, the dielectric spacer 34, or the PCM line 40 are physically exposed. The photoresist layer may be subsequently removed, for example, by ashing.

Generally, a combination including the heater line 30, the heater-capping dielectric plate 32, the phase change material (PCM) line 40, and the in-process conductive barrier plate 42' may be formed over the dielectric isolation layer 24. The bottom surface of the heater line 30 may be formed directly on a first area of a planar top surface 25 of the dielectric isolation layer 24. The phase change material (PCM) line 40 comprises a middle portion that overlies the heater line 30, a first end portion adjoined to a first side of the middle portion and contacting a second area of the planar top surface 25, and a second end portion adjoined to a second side of the middle portion and contacting a third area of the planar top surface 25. A heater-capping dielectric plate 32 may be provided between the heater line 30 and the PCM line 40. The heater-capping dielectric plate 32 contacts a top surface of the heater line 30. A bottom surface of the middle portion of the PCM line 40 contacts a segment of a top surface of the heater-capping dielectric plate 32.

Figure 7C:
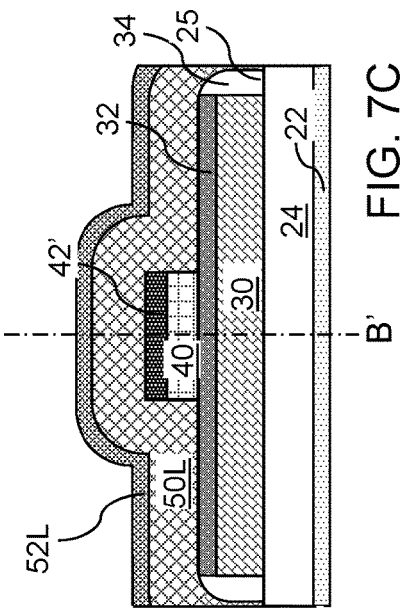
FIGS. 7A-7C are various views of the first exemplary structure after formation of an electrode material layer and an electrode-capping dielectric layer according to the first embodiment of the present disclosure.
Figure 7A:
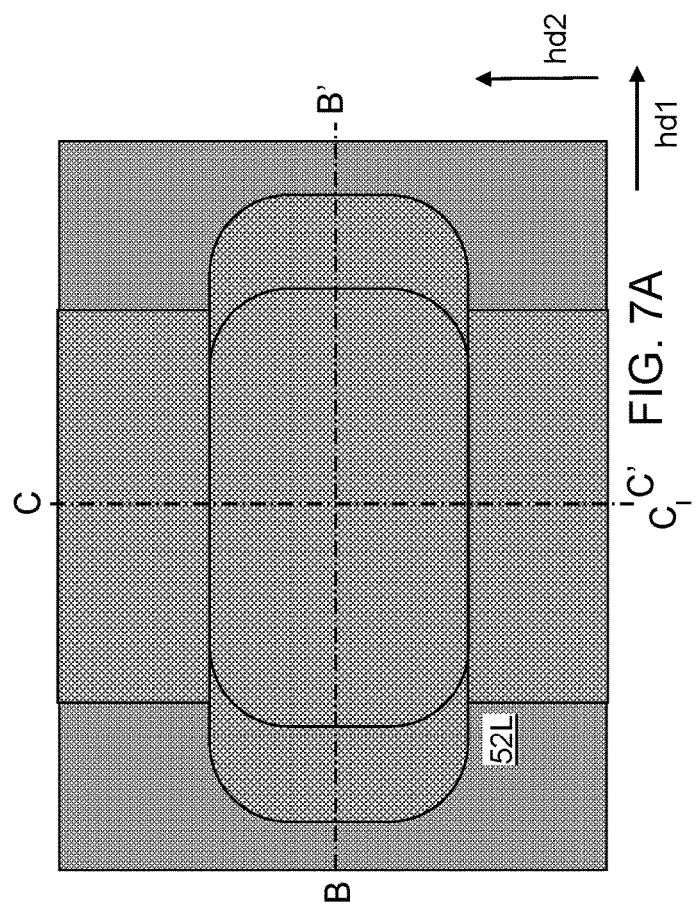
Figure 7B:
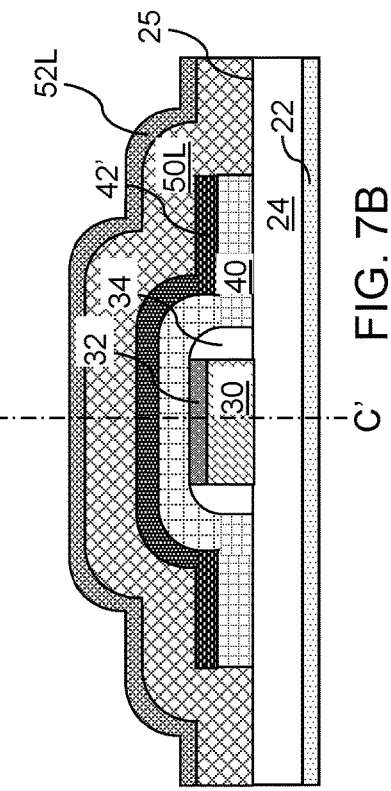

Referring to FIGS. 7A-7C, an electrode material layer 50L and an electrode-capping dielectric layer 52L may be deposited over the in-process conductive barrier plate 42' and the heater-capping dielectric plate 32. The electrode material layer comprises a metallic material such as a refractory metal (such as tungsten, rhenium, tantalum, niobium, or molybdenum), and may have a thickness in a range from nm to 500 nm, such as from 100 nm to 300 nm, although lesser and greater thicknesses may also be used. The electrode-capping dielectric layer 52L may include a dielectric diffusion barrier material such as silicon nitride, silicon carbide, or silicon carbide nitride. Other suitable dielectric diffusion barrier materials are within the contemplated scope of disclosure. The thickness of the electrode-capping dielectric layer 52L may be in a range from 10 nm to 100 nm, such as from 20 nm to 60 nm, although lesser and greater thicknesses may also be used. The electrode material layer may be formed directly on an area of the planar top surface 25 of the dielectric isolation layer 24;

Referring to FIGS. 8A-8C, a photoresist layer (not shown) may be applied over the electrode-capping dielectric layer 52L, and may be lithographically patterned to form two discrete photoresist material portions that overlie a respective end portion of the PCM line 40. In one embodiment, the photoresist layer may be patterned such that each patterned discrete photoresist material portion is located one a respective side of the heater line 30, and is laterally spaced apart from each other along the first horizontal direction. In one embodiment, the two discrete photoresist material portions may be patterned such that the areas of the two discrete photoresist material portions covers the entirety of the contact area between the PCM line 40 and the dielectric isolation layer 24.

An anisotropic etch process may be performed to remove portions of the electrode-capping dielectric layer 52L, the electrode material layer 50L, and the in-process conductive barrier plate 42' that are not masked by the two discrete photoresist material portions. Patterned portions of the electrode material layer 50L comprise electrodes 50 for the PCM line 40. The electrodes 50 may comprise a first electrode contacting three sidewalls of the first end portion of the PCM line 40 and a second electrode 50B contacting three sidewalls of the second end portion of the PCM line 40.

The bottom surface of the heater line 30 contacts first area of a planar top surface 25 of the dielectric isolation layer 24. The first end portion of the PCM line 40 contacts the second area of the planar top surface 25. The second end portion of the PCM line 40 contacts the third area of the planar top surface 25. The first electrode contacts a fourth area of the planar top surface 25. The second electrode 50B contacts a fifth area of the planar top surface 25.

Patterned portions of the electrode-capping dielectric material layer 52L comprise electrode-capping dielectric plates 52. Each electrode-capping dielectric material layer 52 may contact the entirety of a top surface of a respective electrode 50. A horizontally-extending portion of the in-process conducive barrier plate 42' may be removed from above the area of the heater line 30. Patterned remaining portions of the in-process conductive barrier plate 42' comprise a first conductive barrier plate 42A contacting a first area of a top surface of the PCM line 40, and a second conductive barrier plate 42B contacting a second area of the top surface of the PCM line 40. The first electrode 50A contacts the first conductive barrier plate 42A, and the second electrode 50B contacts the second conductive barrier plate 42B.

In one embodiment, the first conductive barrier plate 42A contacts the first end portion of the PCM line 40. The first conductive barrier plate 42A has a first contoured top surface that includes a first horizontal surface segment underlying the first electrode 50A and a first convex surface segment extending upward from the first horizontal surface segment. The second conductive barrier plate 42B contacts the second end portion of the PCM line 40. The second conductive barrier plate 42B has a second contoured top surface that includes a second horizontal surface segment underlying the second electrode 50B and a second convex surface segment extending upward from the second horizontal surface segment.

In one embodiment, the first electrode 50A comprises a first contoured bottom surface contacting an entirety of the first contoured top surface of the first conductive barrier plate 42A, the first convex surface segment, the sidewall of the first end portion of the PCM line 40, and the fourth area of the planar top surface 25 of the dielectric isolation layer 24. The second electrode 50B comprises a second contoured bottom surface contacting an entirety of the second contoured top surface of the second conductive barrier plate 42B, the sidewall of the second end portion of the PCM line 40, and the fifth area of the planar top surface 25 of the dielectric isolation layer 24.

Referring to FIGS. 9A-9C, a dielectric material layer may be deposited over the electrodes 50 and the PCM line 40. The dielectric material layer is herein referred to as a switch-level dielectric material layer 28. Additional metal interconnect structures (652, 658) may be formed in the switch-level dielectric material layer 28. The additional metal interconnect structures (652, 658) are herein referred to as switch-level metal interconnect structures (652, 658), and may comprise switch-level metal line structures 658 and switch-level metal via structures 652.

The switch-level metal via structures 652 may comprise a first electrode contact via structure 6521 contacting the first electrode 50A, a second electrode contact via structure 6522 contacting the second electrode 50B, a first heater contact via structure 6523 contacting a first end portion of the heater line 30, and a second heater contact via structure 6524 contacting a second end portion of the heater line 30. The switch-level metal line structures 658 may comprise a first electrode connection metal line structure 6581 contacting a top surface of the first electrode contact via structure, a second electrode connection metal line structure 6582 contacting a top surface of the second electrode contact via structure 6522, a first heater connection metal line structure 6583 contacting a top surface of the first heater contact via structure 6523, and a second heater connection metal line structure 6584 contacting a top surface of the second heater contact via structure 6524.

Generally, semiconductor devices 701 may be formed on the substrate 8, and metal interconnect structures (612, 618, 622, 628, 631, 638, 642, 648) and dielectric material layers (601, 610, 620, 630, 640) may be formed over the substrate 8. The metal interconnect structures (612, 618, 622, 628, 631, 638, 642, 648) are formed in the dielectric material layers (601, 610, 620, 630, 640). The dielectric isolation layer 24 is formed over metal interconnect structures (612, 618, 622, 628, 631, 638, 642, 648). The first heater contact via structure 6523 may contact a top surface of a first end portion of the heater line 30, and may contact a sidewall of a first end portion of the PCM line 40. The second heater contact via structure 6524 may contact a top surface of a second end portion of the heater line 30, and may contact a sidewall of a second end portion of the PCM line 40.

The two end portions of the heater line 30, the first electrode 50A, and the second electrode 50B may be electrically connected to a respective one of the metal interconnect structures (612, 618, 622, 628, 631, 638, 642, 648) by forming additional metal interconnect structures (652, 658), which include additional switch-level metal via structures (not illustrated) that connect a respective one of the switch-level metal line structures 658 to a respective one of the fourth metal line structures 648.

Referring to FIGS. 10A-10C, a second exemplary structure according to a second embodiment of the present disclosure may be derived from the first exemplary structure illustrated in FIG. 1 by performing the processing steps of FIGS. 5A-5C. In other words, the second exemplary structure may be derived from the first exemplary structure illustrated in FIG. 1 by depositing a phase change material layer 40L and a conductive barrier material layer 42L. The phase change material layer 40L may have the same material composition and the same thickness range as in the first embodiment. The conductive barrier material layer 42L may have the same material composition and the same thickness range as in the first embodiment.

Referring to FIGS. 11A-11C, a photoresist layer (not shown) may be applied over the conductive barrier material layer 42L, and may be lithographically patterned to provide a patterned photoresist layer including an elongated photoresist material portion. In one embodiment, the elongated shape may be a rectangular shape having a uniform width along a first horizontal direction hd1 and having a length that is greater than the width along a second horizontal direction hd2. Unmasked portions of a layer stack including the conductive barrier material layer 42L, the PCM material layer the heater-capping dielectric layer 32L, and the heater material layer 30L may be etched by performing an anisotropic etch process that uses the patterned photoresist material portion as an etch mask. A remaining portion of the conductive barrier material layer 42L comprises an in-process conductive barrier plate 42' (which is patterned further in subsequent processing steps). A remaining portion of the PCM material layer 40L comprises a phase change material line 40, which is also referred to as a PCM line 40. A remaining portion of the heater-capping dielectric layer 32L comprises a heater-capping dielectric plate 32. A remaining portion of the heater material layer 30L comprises a heater line 30.

In one embodiment, the in-process conductive barrier plate 42', the PCM line the heater-capping plate 32, and the heater line 30 may have the same shape and the same area. In one embodiment, the same shape may be a rectangular shape having a width along a first horizontal direction hd1 and having a length along a second horizontal direction hd2. Overlying or underlying sidewalls of the in-process conductive barrier plate 42', the PCM line 40, the heater-capping plate 32, and the heater line 30 may be vertically-coincident, i.e., may be located within a same vertical plane. The patterned photoresist layer may be subsequently removed, for example, by ashing.

Generally, a combination including the heater line 30, the phase change material (PCM) line 40, and the in-process conductive barrier plate 42' may be formed over the dielectric isolation layer 24. The bottom surface of the heater line 30 is formed directly on a first area of a planar top surface 25 of the dielectric isolation layer 24. A heater-capping dielectric plate 32 may be provided between the heater line 30 and the PCM line 40. The heater-capping dielectric plate 32 contacts a top surface of the heater line 30. A bottom surface of the PCM line 40 contacts a segment of the top surface of the heater-capping dielectric plate 32.

Referring to FIGS. 12A-12C, a dielectric spacer material layer 34L may be formed by conformal deposition of a dielectric spacer material. The dielectric spacer material may comprise undoped silicate glass or a doped silicate glass, and may be formed, for example, by chemical vapor deposition. The lateral thickness of vertically-extending portions of the dielectric spacer material layer 34L over sidewalls of the vertical stack of the heater line 30, the heater-capping dielectric plate 32, the PCM line 40 and the in-process conductive barrier plate 42' may be in a range from 100 nm to 300 nm, such as from 120 nm to 200 nm, although lesser and greater lateral thicknesses may also be used.

Referring to FIGS. 13A-13C, an anisotropic etch process may be performed to remove horizontally-extending portions of the dielectric spacer material layer 34L. Specifically, the anisotropic etch process removes a portion of the dielectric spacer material layer 34L overlying the top surface of the in-process conductive barrier plate 42' and a portions of the dielectric spacer material layer 34L that are laterally spaced from sidewalls of the heater line 34 by a distance greater than the lateral thickness of the dielectric spacer material layer 34L. A remaining portion of the dielectric spacer material layer 34L constitutes a dielectric spacer 34. The dielectric spacer 34 may be formed around, and directly on, the heater line 30.

In one embodiment, a bottom surface of the dielectric spacer 34 has an inner periphery that coincides with a periphery of the bottom surface of the heater line 30, and an outer periphery of the bottom surface of the dielectric spacer 34 is laterally offset from the inner periphery by a uniform lateral offset distance, which is the lateral thickness of the dielectric spacer 34. The dielectric spacer 34 laterally surrounds the heater line 30, the heater-capping dielectric plate 32, the PCM line 40, and the in-process conductive barrier plate 42'. The dielectric spacer 34 may contact the entirety of the each sidewall of the heater line 30, the heater-capping dielectric plate 32, and the PCM line 40, and may contact at least a lower portion of each sidewall of the in-process conductive barrier plate 42'. In one embodiment, the entirety of the bottom surface of the dielectric spacer 34 may be in contact with an area of the planar top surface 25 of the dielectric isolation layer 24.

Referring to FIGS. 14A-14C, an electrode material layer 50L and an electrode-capping dielectric layer 52L may be deposited over the in-process conductive barrier plate 42'. The electrode material layer 50L comprises a metallic material such as a refractory metal (such as tungsten, rhenium, tantalum, niobium, or molybdenum), and may have a thickness in a range from 50 nm to 500 nm, such as from 100 nm to 300 nm, although lesser and greater thicknesses may also be used. The electrode-capping dielectric layer 52L comprises a dielectric diffusion barrier material such as silicon nitride, silicon carbide, or silicon carbide nitride. The thickness of the electrode-capping dielectric layer 52L may be in a range from 10 nm to 100 nm, such as from 20 nm to 60 nm, although lesser and greater thicknesses may also be used. The electrode material layer 50L may be formed directly on an area of the planar top surface 25 of the dielectric isolation layer 24.

Referring to FIGS. 15A-15C, a photoresist layer (not shown) may be applied over the electrode-capping dielectric layer 52L, and may be lithographically patterned to form two discrete photoresist material portions. Two discrete photoresist material portions may be formed on opposite side of the two lengthwise sidewalls of the PCM line 40 that laterally extend along the second horizontal direction hd2. In one embodiment, the two discrete photoresist material portions may be laterally spaced apart from each other along the first horizontal direction hd1. Each discrete photoresist material portion may cover a respective segment of the contact area between the electrode material layer 50L and the dielectric isolation layer 24, a respective segment of an outer sidewall of the dielectric spacer 34, and a respective segment of a top surface of the in-process conductive barrier plate 42'. A middle segment of the top surface of the in-process conductive barrier plate 42' is located between two covered segments of the in-process conductive barrier plate 42'.

An anisotropic etch process may be performed to remove portions of the electrode-capping dielectric layer 52L, the electrode material layer 50L, and the in-process conductive barrier plate 42' that are not masked by the two discrete photoresist material portions. Patterned portions of the electrode material layer 50L comprise electrodes 50 for the PCM line 40. The electrodes 50 may comprise a first electrode and a second electrode 50B. The bottom surface of the heater line 30 contacts first area of a planar top surface 25 of the dielectric isolation layer 24. The first electrode 50A contacts an area (such as a second area) of the planar top surface 25. The second electrode 50B contacts another area (such as a third area) of the planar top surface 25.

Patterned portions of the electrode-capping dielectric material layer 52L comprise electrode-capping dielectric plates 52. Each electrode-capping dielectric material layer 52 may contact the entirety of a top surface of a respective electrode 50. An unmasked portion of the in-process conducive barrier plate 42' may be removed from above a middle segment of the top surface of the PCM line 40. Patterned remaining portions of the in-process conductive barrier plate 42' comprise a first conductive barrier plate 42A contacting a first area of a top surface of the PCM line 40, and a second conductive barrier plate 42B contacting a second area of the top surface of the PCM line 40.

The first electrode 50A contacts the entirety of the top surface of the first conductive barrier plate 42A, and the second electrode 50B contacts the entirety of the top surface of the second conductive barrier plate 42B. In one embodiment, the first conductive barrier plate 42A contacts a first area of the top surface of the PCM line 40. The second conductive barrier plate 42B contacts a second area of the top surface of the PCM line 40. The first electrode 50A does not directly contact the PCM line 40, but is electrically connected to a first portion of the PCM line 40 through the first conductive barrier plate 42A. The second electrode 50B does not directly contact the PCM line 40, but is electrically connected to a second portion of the PCM line through the second conductive barrier plate 42B.

Referring to FIGS. 16A-16C, a dielectric material layer may be deposited over the electrodes 50. The dielectric material layer is herein referred to as a switch-level dielectric material layer 28. Additional metal interconnect structures (652, 658) may be formed in the switch-level dielectric material layer 28. The additional metal interconnect structures (652, 658) are herein referred to as switch-level metal interconnect structures (652, 658), and may comprise switch-level metal line structures 658 and switch-level metal via structures 652.

The switch-level metal via structures 652 may comprise a first electrode contact via structure 6521 contacting the first electrode 50A, a second electrode contact via structure 6522 contacting the second electrode 50B, a first heater contact via structure 6523 contacting a first end portion of the heater line 30, and a second heater contact via structure 6524 contacting a second end portion of the heater line 30. The switch-level metal line structures 658 may comprise a first electrode connection metal line structure 6581 contacting a top surface of the first electrode contact via structure, a second electrode connection metal line structure 6582 contacting a top surface of the second electrode contact via structure 6522, a first heater connection metal line structure 6583 contacting a top surface of the first heater contact via structure 6523, and a second heater connection metal line structure 6584 contacting a top surface of the second heater contact via structure 6524.

Generally, semiconductor devices 701 may be formed on the substrate 8, and metal interconnect structures (612, 618, 622, 628, 631, 638, 642, 648) and dielectric material layers (601, 610, 620, 630, 640) may be formed over the substrate 8. The metal interconnect structures (612, 618, 622, 628, 631, 638, 642, 648) are formed in the dielectric material layers (601, 610, 620, 630, 640). The dielectric isolation layer 24 is formed over metal interconnect structures (612, 618, 622, 628, 631, 638, 642, 648). The first heater contact via structure 6523 may contact a top surface of a first end portion of the heater line 30, and may contact a sidewall of a first end portion of the PCM line 40. The second heater contact via structure 6524 may contact a top surface of a second end portion of the heater line 30, and may contact a sidewall of a second end portion of the PCM line 40.

The two end portions of the heater line 30, the first electrode 50A, and the second electrode 50B may be electrically connected to a respective one of the metal interconnect structures (612, 618, 622, 628, 631, 638, 642, 648) by forming additional metal interconnect structures (652, 658), which include additional switch-level metal via structures (not illustrated) that connect a respective one of the switch-level metal line structures 658 to a respective one of the fourth metal line structures 648.

In one embodiment, the first heater contact via structure 6523 contacts a top surface of a first end portion of the heater line 30, a sidewall of a first end portion of the PCM line 40, and a sidewall of a first end portion of the heater-capping dielectric plate 32. The second heater contact via structure 6524 contacts a top surface of a second end portion of the heater line 30, a sidewall of a second end portion of the PCM line 40, and a sidewall of a second end portion of the heater-capping dielectric plate 32. Sidewalls of the PCM line 40 may be vertically coincident with sidewalls of the heater line 30, and with sidewall of the heater-capping dielectric plate 32.

Figure 17:
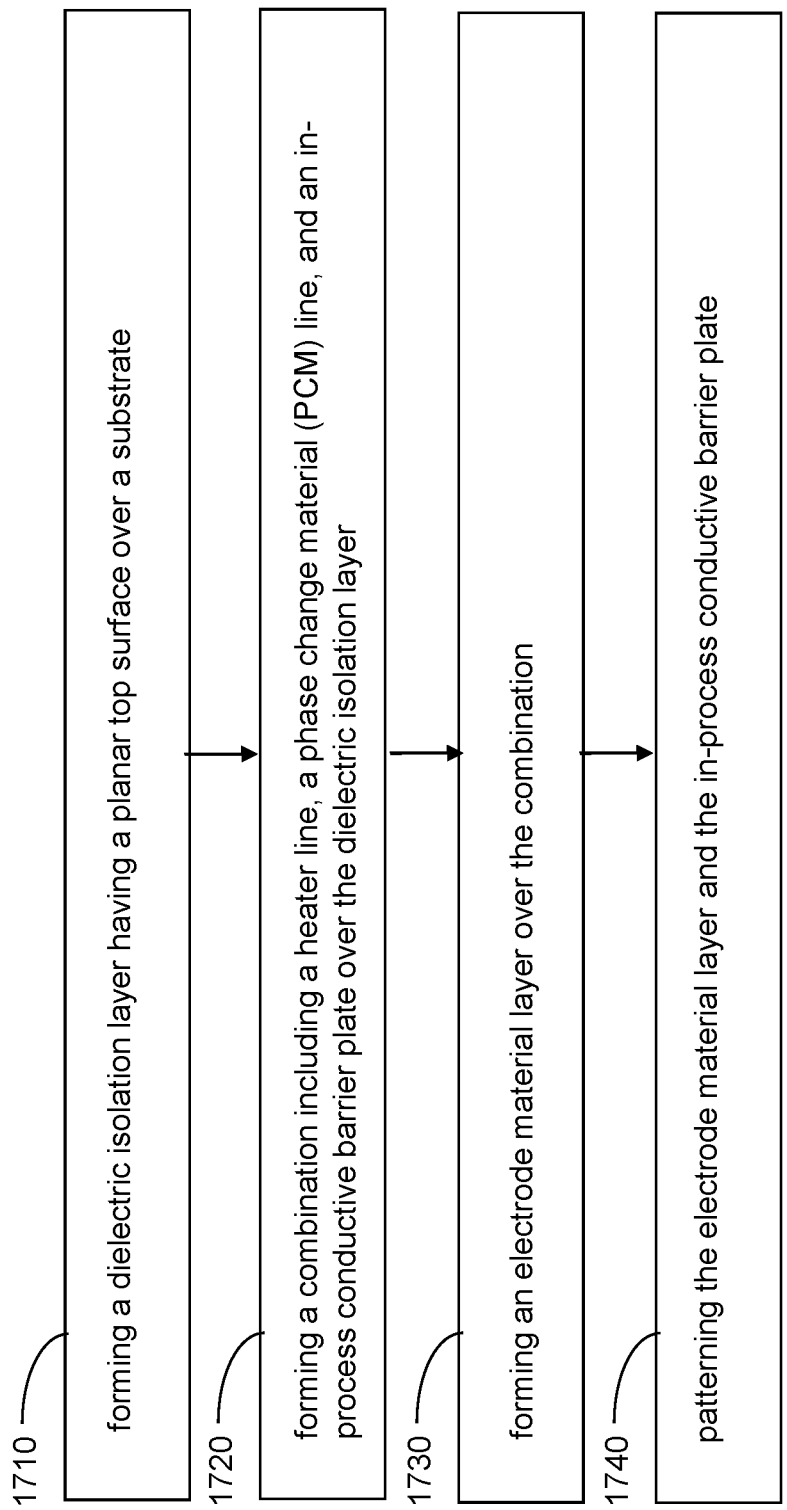
FIG. 17 is a flowchart that illustrates the general processing steps for manufacturing the semiconductor devices according to an embodiment of the present disclosure.

Referring to FIG. 17, a flowchart illustrates the general processing steps for manufacturing the semiconductor devices according to an embodiment of the present disclosure.

Referring to step 1710 and FIGS. 1 and 10A-10C, a dielectric isolation layer 24 having a planar top surface 25 may be formed over a substrate 8.

Referring to step 1720 and FIGS. 1-6C and 10A-11C, a combination including a heater line 30, a phase change material (PCM) line 40, and an in-process conductive barrier plate 42' is formed over the dielectric isolation layer 24. A bottom surface of the heater line 30 is formed directly on a first area of a planar top surface 25 of the dielectric isolation layer 24.

Referring to step 1730 and FIGS. 7A-7C and 12A-14C, an electrode material layer 50L may be formed over the combination including the heater line 30, the PCM line 40, and the in-process conductive barrier plate 42'. The electrode material layer 50L is formed directly on an area of the planar top surface 25 of the dielectric isolation layer 24.

Referring to step 1740 and FIGS. 8A-9C and 15A-16C, the electrode material layer 50L and the in-process conductive barrier plate 42' may be patterned. Patterned portions of the in-process conductive barrier plate 42' comprise a first conductive barrier plate 42A contacting a first area of a top surface of the PCM line 40, and a second conductive barrier plate 42B contacting a second area of the top surface of the PCM line 40. Patterned portions of the electrode material layer 50L comprise a first electrode 50A contacting the first conductive barrier plate 42A and a second electrode 50B contacting the second conductive barrier plate 42B.

Referring to all drawings and according to various embodiments of the present disclosure, a semiconductor structure is provided, which may include: a dielectric isolation layer 24 having a planar top surface 25 and located over a substrate 8; a heater line 30 contacting a first area of the planar top surface 25; a phase change material (PCM) line 40 including a middle portion that overlies the heater line 30, a first end portion adjoined to a first side of the middle portion and contacting a second area of the planar top surface 25, and a second end portion adjoined to a second side of the middle portion and contacting a third area of the planar top surface 25; a first electrode 50A contacting a sidewall of the first end portion of the PCM line 40 and contacting a fourth area of the planar top surface 25; and a second electrode 50B contacting a sidewall of the second end portion of the PCM line 40 and contacting a fifth area of the planar top surface 25.

In one embodiment, the semiconductor structure may also include a dielectric spacer 34 laterally surrounding the heater line 30, wherein: a bottom surface of the dielectric spacer 34 has an inner periphery that coincides with a periphery of a bottom surface of the heater line 30; and an outer periphery of the bottom surface of the dielectric spacer 34 is laterally offset from the inner periphery by a uniform lateral offset distance. In one embodiment, an entirety of the bottom surface of the dielectric spacer 34 is in contact with an additional area of the top surface of the dielectric isolation layer 24. In one embodiment, the semiconductor structure may also include a heater-capping dielectric plate 32 contacting a top surface of the heater line 30, wherein a bottom surface of the middle portion of the PCM line 40 contacts a segment of a top surface of the heater-capping dielectric plate 32. In one embodiment, the semiconductor structure may also include: a first conductive barrier plate 42A contacting the first end portion of the PCM line 40 and having a first contoured top surface that includes a first horizontal surface segment underlying the first electrode and a first convex surface segment extending upward from the first horizontal surface segment; and a second conductive barrier plate 42B contacting the second end portion of the PCM line 40 and having a second contoured top surface that includes a second horizontal surface segment underlying the second electrode and a second convex surface segment extending upward from the second horizontal surface segment. In one embodiment, the first electrode 50A may include a first contoured bottom surface contacting an entirety of the first contoured top surface of the first conductive barrier plate 42A, the first convex surface segment, the sidewall of the first end portion of the PCM line 40, and the fourth area of the top surface of the dielectric isolation layer 24; and the second electrode 50B may include second contoured bottom surface contacting an entirety of the second contoured top surface of the second conductive barrier plate 42B, the sidewall of the second end portion of the PCM line 40, and the fifth area of the top surface of the dielectric isolation layer 24. In one embodiment, the semiconductor structure may also include: semiconductor devices 701 located on the substrate 8; and metal interconnect structures (612, 618, 622, 628, 631, 638, 642, 648) located within dielectric material layers (601, 610, 620, 630, 640) that overlie the substrate 8 and underlie the dielectric isolation layer 24, wherein the heater line 30, the first electrode 50A, and the second electrode 50B are electrically connected to a respective one of the metal interconnect structures (612, 618, 622, 628, 631, 638, 642, 648).

According to another aspect of the present disclosure, a semiconductor structure is provided, which may include: a dielectric isolation layer 24 having a planar top surface 25 and located over a substrate 8; a heater line 30 contacting a first area of the planar top surface 25 of the dielectric isolation layer 24; a phase change material (PCM) line 40 overlying the heater-capping dielectric plate 32; a first conductive barrier plate 42A contacting a first segment of a top surface of the PCM line 40; a second conductive barrier plate 42B contacting a second segment of the top surface of the PCM line 40; a first electrode 50A contacting a top surface of the first conductive barrier plate 42A; and a second electrode 50B contacting a top surface of the second conductive barrier plate 42B.

In one embodiment, the first electrode 50A contacts a second area of the top surface of the dielectric isolation layer 24; and the second electrode 50B contacts a third area of the top surface of the dielectric isolation layer 24. In one embodiment, the semiconductor structure may also include a dielectric spacer 34 laterally surrounding the heater line 30, the PCM line 40, the first conductive barrier plate 42A, and the second conductive barrier plate 42B. In one embodiment, a bottom surface of the dielectric spacer 34 has an inner periphery that coincides with a periphery of a bottom surface of the heater line 30; and an outer periphery of the bottom surface of the dielectric spacer 34 is laterally offset from the inner periphery by a uniform lateral offset distance. In one embodiment, the first electrode 50A contacts a first outer sidewall of the dielectric spacer 34; the second electrode 50B contacts a second outer sidewall of the dielectric spacer 34; the first conductive barrier plate 42A contacts a first inner sidewall of the dielectric spacer 34; and the second conductive barrier plate 42B contacts a second inner sidewall of the dielectric spacer 34. In one embodiment, a first heater contact via structure 6523 contacting a top surface of a first end portion of the heater line 30 and contacting a sidewall of a first end portion of the PCM line 40; and a second heater contact via structure 6524 contacting a top surface of a second end portion of the heater line 30 and contacting a sidewall of a second end portion of the PCM line 40. In one embodiment, the semiconductor structure may also include a heater-capping dielectric plate 32 overlying the heater line 30 and underlying the PCM line 40, wherein sidewalls of the PCM line 40 are vertically coincident with sidewalls of the heater line 30 and are vertically coincident with sidewall of the heater-capping dielectric plate 32.

The phase change material devices of the present disclosure may be used as a phase change material (PCM) switch device, which may provide at least two different resistive states between the first electrode 50A and the second electrode 50B depending on the rate of the cooling rate of the phase change material during a programming process. In a first part of a programming process, sufficient electrical current may flow through the heater to raise the temperature of a middle portion of the PCM line 40 close to the melting point of the PCM material within the PCM line 40. In a second part of the programming process, the rate of decrease in the electrical current may be selected either to induce crystallization of the PCM material in the middle portion of the PCM line 40, or to induce amorphous solidification of the PCM material in the middle portion of the PCM line 40. In embodiments in which the middle portion of the PCM line 40 is in a crystalline state, the electrical resistance between the first electrode 50A and the second electrode 50B is in a low state. In embodiments in which the middle portion of the PCM line 40 is in an amorphous state, the electrical resistance between the first electrode 50A and the second electrode 50B is in a high state. In embodiments in which the electrical resistance between the first electrode 50A and the second electrode 50B is in the low state, the PCM switch device of the present disclosure provides an on-state (i.e., a connected state) between the first electrode 50A and the second electrode 50B. In embodiments in which the electrical resistance between the first electrode 50A and the second electrode 50B is in the high state, the PCM switch device of the present disclosure provides an off-state (i.e., a disconnected state) between the first electrode 50A and the second electrode 50B.

The phase change material switches of the present disclosure may be programmed multiple times into new states as needed. The phase change material switch of the present disclosure may be used to increase, or decrease, interconnected components that are arranged in a parallel connection. Such interconnected components may comprise capacitors, inductors, diodes, or any other passive or active semiconductor devices. The various phase change material switches of the present disclosure may be advantageously used to provide versatility in many applications including, but not limited to, radio-frequency (RF) applications, high power applications, consumer applications, and/or for mass storage applications.

The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

The PCM switch device of the present disclosure may be manufactured without using a chemical mechanical planarization process until formation of the first electrode 50A and the second electrode 50B. A planarization process may be used only during formation of the metal interconnect structures (652, 658). Thus, the PCM switch device of the present disclosure may be manufactured at a low manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a dielectric isolation layer having a top surface and located over a substrate;
 a heater line contacting a first area of the top surface;
 a phase change material (PCM) line comprising a middle portion that overlies the heater line, a first end portion adjoined to a first side of the middle portion and contacting a second area of the top surface, and a second end portion adjoined to a second side of the middle portion and contacting a third area of the top surface;
 a first electrode contacting a sidewall of the first end portion of the PCM line and contacting a fourth area of the top surface; and
 a second electrode contacting a sidewall of the second end portion of the PCM line and contacting a fifth area of the top surface.

2. The semiconductor structure of claim 1, further comprising a dielectric spacer laterally surrounding the heater line, wherein:
 a bottom surface of the dielectric spacer has an inner periphery that coincides with a periphery of a bottom surface of the heater line; and
 an outer periphery of the bottom surface of the dielectric spacer is laterally offset from the inner periphery by a uniform lateral offset distance.

3. The semiconductor structure of claim 2, wherein an entirety of the bottom surface of the dielectric spacer is in contact with an additional area of the top surface of the dielectric isolation layer.

4. The semiconductor structure of claim 1, further comprising a heater-capping dielectric plate contacting a top surface of the heater line, wherein a bottom surface of the middle portion of the PCM line contacts a segment of a top surface of the heater-capping dielectric plate.

5. The semiconductor structure of claim 1, further comprising:
 a first conductive barrier plate contacting the first end portion of the PCM line and having a first contoured top surface that includes a first horizontal surface segment underlying the first electrode and a first convex surface segment extending upward from the first horizontal surface segment; and
 a second conductive barrier plate contacting the second end portion of the PCM line and having a second contoured top surface that includes a second horizontal surface segment underlying the second electrode and a second convex surface segment extending upward from the second horizontal surface segment.

6. The semiconductor structure of claim 5, wherein:
 the first electrode comprises a first contoured bottom surface contacting an entirety of the first contoured top surface of the first conductive barrier plate, the first convex surface segment, the sidewall of the first end portion of the PCM line, and the fourth area of the top surface of the dielectric isolation layer; and
 the second electrode comprises a second contoured bottom surface contacting an entirety of the second contoured top surface of the second conductive barrier plate, the sidewall of the second end portion of the PCM line, and the fifth area of the top surface of the dielectric isolation layer.

7. The semiconductor structure of claim 1, further comprising:
 semiconductor devices located on the substrate; and
 metal interconnect structures located within dielectric material layers that overlie the substrate and underlie the dielectric isolation layer, wherein the heater line, the first electrode, and the second electrode are electrically connected to a respective one of the metal interconnect structures.

8. A semiconductor structure comprising:
 a dielectric isolation layer having a top surface and located over a substrate;
 a heater line contacting a first area of the top surface of the dielectric isolation layer;
 a phase change material (PCM) line overlying a heater-capping dielectric plate;

a first conductive barrier plate contacting a first segment of a top surface of the PCM line;
a second conductive barrier plate contacting a second segment of the top surface of the PCM line;
a first electrode contacting a top surface of the first conductive barrier plate;
a second electrode contacting a top surface of the second conductive barrier plate; and
a heater-capping dielectric plate overlying the heater line and underlying the PCM line, wherein sidewalls of the PCM line are vertically coincident with sidewalls of the heater line and are vertically coincident with sidewall of the heater-capping dielectric plate.

9. The semiconductor structure of claim 8, wherein:
the first electrode contacts a second area of the top surface of the dielectric isolation layer; and
the second electrode contacts a third area of the top surface of the dielectric isolation layer.

10. The semiconductor structure of claim 8, further comprising a dielectric spacer laterally surrounding the heater line, the PCM line, the first conductive barrier plate, and the second conductive barrier plate.

11. The semiconductor structure of claim 10, wherein:
a bottom surface of the dielectric spacer has an inner periphery that coincides with a periphery of a bottom surface of the heater line; and
an outer periphery of the bottom surface of the dielectric spacer is laterally offset from the inner periphery by a uniform lateral offset distance.

12. The semiconductor structure of claim 11, wherein:
the first electrode contacts a first outer sidewall of the dielectric spacer;
the second electrode contacts a second outer sidewall of the dielectric spacer;
the first conductive barrier plate contacts a first inner sidewall of the dielectric spacer; and
the second conductive barrier plate contacts a second inner sidewall of the dielectric spacer.

13. The semiconductor structure of claim 8, further comprising:
a first heater contact via structure contacting a top surface of a first end portion of the heater line and contacting a sidewall of a first end portion of the PCM line; and
a second heater contact via structure contacting a top surface of a second end portion of the heater line and contacting a sidewall of a second end portion of the PCM line.

14. The semiconductor structure of claim 1, further comprising a heater-capping dielectric plate overlying the heater line and underlying the PCM line, wherein sidewalls of the PCM line are vertically coincident with sidewalls of the heater line and are vertically coincident with sidewall of the heater-capping dielectric plate.

15. A semiconductor structure comprising:
a dielectric isolation layer having a top surface and located over a substrate;
a heater line contacting a first area of the top surface;
a phase change material (PCM) line comprising a middle portion that overlies the heater line, a first end portion adjoined to a first side of the middle portion and contacting a second area of the top surface, and a second end portion adjoined to a second side of the middle portion and contacting a third area of the top surface; and
a dielectric spacer laterally surrounding the heater line, wherein:
a bottom surface of the dielectric spacer has an inner periphery that coincides with a periphery of a bottom surface of the heater line; and
an outer periphery of the bottom surface of the dielectric spacer is laterally offset from the inner periphery by a uniform lateral offset distance.

16. The semiconductor structure of claim 15, wherein an entirety of the bottom surface of the dielectric spacer is in contact with an additional area of the top surface of the dielectric isolation layer.

17. The semiconductor structure of claim 15, further comprising a heater-capping dielectric plate contacting a top surface of the heater line, wherein a bottom surface of the middle portion of the PCM line contacts a segment of a top surface of the heater-capping dielectric plate.

18. The semiconductor structure of claim 15, further comprising:
a first conductive barrier plate contacting the first end portion of the PCM line and having a first contoured top surface that includes a first horizontal surface segment underlying the first electrode and a first convex surface segment extending upward from the first horizontal surface segment; and
a second conductive barrier plate contacting the second end portion of the PCM line and having a second contoured top surface that includes a second horizontal surface segment underlying the second electrode and a second convex surface segment extending upward from the second horizontal surface segment.

19. The semiconductor structure of claim 18, wherein:
the first electrode comprises a first contoured bottom surface contacting an entirety of the first contoured top surface of the first conductive barrier plate, the first convex surface segment, the sidewall of the first end portion of the PCM line, and the fourth area of the top surface of the dielectric isolation layer; and
the second electrode comprises a second contoured bottom surface contacting an entirety of the second contoured top surface of the second conductive barrier plate, the sidewall of the second end portion of the PCM line, and the fifth area of the top surface of the dielectric isolation layer.

20. The semiconductor structure of claim 15, further comprising:
semiconductor devices located on the substrate; and
metal interconnect structures located within dielectric material layers that overlie the substrate and underlie the dielectric isolation layer, wherein the heater line, the first electrode, and the second electrode are electrically connected to a respective one of the metal interconnect structures.

* * * * *